United States Patent
Sugiyama

(10) Patent No.: US 9,497,330 B2
(45) Date of Patent: Nov. 15, 2016

(54) SIGNAL PROCESSING METHOD, SIGNAL PROCESSING DEVICE, AND SIGNAL PROCESSING PROGRAM

(75) Inventor: Akihiko Sugiyama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 1320 days.

(21) Appl. No.: 13/120,777

(22) PCT Filed: Sep. 15, 2009

(86) PCT No.: PCT/JP2009/066067
§ 371 (c)(1),
(2), (4) Date: Mar. 24, 2011

(87) PCT Pub. No.: WO2010/035657
PCT Pub. Date: Apr. 1, 2010

(65) Prior Publication Data
US 2011/0176688 A1 Jul. 21, 2011

(30) Foreign Application Priority Data
Sep. 26, 2008 (JP) .................... 2008-247272

(51) Int. Cl.
*H04B 3/20* (2006.01)
*G10K 11/16* (2006.01)
(Continued)

(52) U.S. Cl.
CPC ......... *H04M 9/082* (2013.01); *H03H 21/0012* (2013.01); *H03H 21/0043* (2013.01); *H04B 3/23* (2013.01); *H04M 3/56* (2013.01); *H04N 7/15* (2013.01); *H04R 3/02* (2013.01)

(58) Field of Classification Search
CPC ........ H04M 9/082; H04M 3/56; H04B 3/23; H04R 3/02; H03H 21/0012; H03H 21/0043; H04N 7/15

USPC ............ 381/66, 71.1, 71.11; 370/286; 379/406.01, 406.05–406.06, 379/406.08–406.09; 455/570; 708/322
See application file for complete search history.

(56) References Cited

U.S. PATENT DOCUMENTS

| | | | |
|---|---|---|---|
| 5,960,077 A * | 9/1999 | Ishii | H04B 3/23 379/406.08 |
| 6,577,731 B1 | 6/2003 | Sugiyama | |
| 2002/0101981 A1 * | 8/2002 | Sugiyama | 379/406.01 |

FOREIGN PATENT DOCUMENTS

| | | |
|---|---|---|
| JP | 4-284732 A | 10/1992 |
| JP | 9200092 A | 7/1997 |
| JP | 11-004183 A | 1/1999 |
| JP | 2000-078061 A | 3/2000 |
| JP | 2002-261661 A | 9/2002 |

OTHER PUBLICATIONS

Office Action, dated for Jun. 12, 2013, issued by the Japanese Patent Office in counterpart Japanese Application No. 2010-530814.
(Continued)

*Primary Examiner* — Davetta W Goins
*Assistant Examiner* — Daniel Sellers
(74) *Attorney, Agent, or Firm* — Sughrue Mion, PLLC

(57) ABSTRACT

Provided is a signal processing method which receives a plurality of reception signals and subtracts pseudo-echoes generated by a plurality of adaptive filters which input the reception signals, from a plurality of echoes generated by the reception signals, thereby reducing the echoes. The method delays two or more of the reception signals so as to generate delayed reception signals and inputs the reception signals and the delayed reception signals to the adaptive filters so as to generate pseudo-echoes.

27 Claims, 14 Drawing Sheets

(51) Int. Cl.
  *H04M 9/08*    (2006.01)
  *H04B 1/38*    (2015.01)
  *G06F 17/10*   (2006.01)
  *H04B 3/23*    (2006.01)
  *H03H 21/00*   (2006.01)
  *H04R 3/02*    (2006.01)
  *H04M 3/56*    (2006.01)
  *H04N 7/15*    (2006.01)

(56) References Cited

OTHER PUBLICATIONS

A Stereo Echo Canceler with Correct Echo-Path Identification Based on an Input-Sliding Technique; IEEE Transactions on Signal Processing, vol. 49, No. 11, Nov. 2001.

* cited by examiner

SIGNAL PROCESSING METHOD, SIGNAL PROCESSING DEVICE, AND SIGNAL PROCESSING PROGRAM

CROSS REFERENCE TO RELATED APPLICATIONS

This application is a National Stage of International Application No. PCT/JP2009/066067 filed on Sep. 15, 2009, which claims priority from Japanese Patent Application No. 2008-247272, filed on Sep. 26, 2008, the contents of all of which are incorporated herein by reference in their entirety.

TECHNICAL FIELD

The present invention relates to a signal processing method, a signal processing apparatus, and a signal processing program.

BACKGROUND ART

As a signal processing apparatus for canceling echoes caused by received signals propagating through spatial acoustic paths in a system using plural received signals and a single or plural transmission signals, the apparatus of a linear coupled type is disclosed in Non-Patent Literature 1. A block diagram of a multichannel signal processing apparatus of a linear coupled type in the case that the number of channels is two, namely, in the case of the signal processing apparatus having a stereo signal as a target, is shown in FIG. 17. According to Patent Literature 1, the apparatus of the linear coupled type has a problem that the coefficients have an indefinite number, namely a problem that adaptive filter coefficients converge to indefinite values other than values equal to the features of the echo paths (correct solutions). The filter coefficient value that has converged depends upon a cross correlation between the filter input signals, and thus, when the cross correlation is changed due to movement etc. of a far-end talker, the correct coefficient value also varies. A variation in the correct coefficient value caused by a change in the cross correlation means that the echo canceling capability is degraded even with no variation in the echo paths. Thus, the residual echoes are perceived, and thus, a speech quality is degraded.

In order to solve this problem, the signal processing method in which a single adaptive filter per channel estimates echoes caused by signals propagating from a single sound source in a plurality of paths by generating pseudo echoes (echo replicas) with adaptive filters corresponding one to one to mixed signals with one received signal as an input is disclosed in Patent Literature 2 A problem that the coefficients have an indefinite number does not exist in this signal processing method because one adaptive filter cancels the echo to be generated on one channel. As a result, the adaptive filter coefficients converge to optimum values that are uniquely determined. However, the Non-patent Literature 2 discloses evaluation results proving that the fact that the echo canceling capability is degraded when the parameters determined by the environment in use such as the locations of microphones receiving the taker's voice are not within a certain range. Hence, in order to use the cancellation apparatus in a wide variety of environments, a multichannel echo canceller of a linear coupled type has to be used.

Based upon this premise, Patent Literature 2 discloses the method capable of uniquely determining the adaptive filter coefficients by delaying the received signal of the multichannel echo canceller of the linear coupled type, thereby to generate the delayed signal, and continuously and mutually alternating this as a new received signal with the received signal. In this signal processing method, the number of conditionals used to calculate the adaptive filter coefficients is increased because of the introduction of the delayed received signals, whereby a problem that the solution, being the adaptive filter coefficient, becomes indefinite does not occur. As a result, the adaptive filter coefficients converge to optimum values that are uniquely determined. However, with the case of the method proposed in the Patent Literature 2, a movement of the acoustic image may often be perceived when the received signal and the delayed received signal are switched. The movement of the acoustic image is perceived as an unnatural sound because it seems as if the acoustic image had moved even though it does not move as a matter of fact, and hence, a subjective sound quality of the received signals is degraded. In order to solve this, the method of correcting the amplitudes of signals in both channels when the received signal and the delayed received signal are switched is disclosed in Patent Literature 3.

On the other hand, the method capable of uniquely determining the adaptive filter coefficients by applying a non-linear processing to the received signals in both channels instead of switching the received signal and the delayed received signal is disclosed in Non-patent Literature 3. However, Non-patent Literature 4 makes it clear that the methods disclosed in the Patent Literature 2, the Patent Literature 3, and the Non-patent Literature 3 provide a slow convergence rate, respectively, as compared with the multichannel echo canceller of the linear coupled type. It is shown in the Non-patent Literature 4 that the method disclosed in the Non-patent Literature 3 provides a yet slower convergence rate as compared with each of the method disclosed in the Patent Literature 2 and the method disclosed in the Patent Literature 3.

CITATION LIST

Patent Literature

PTL 1: JP-P1992-284732A
PTL 2: JP-P1999-004183A
PTL 3: JP-P2000-078061A

Non-Patent Literature

NON-PTL 1: The Technical Report of the institute of Electronics, Information and Communication Engineers (IEICE) of Japan, Vol. 84, No. 330, pp. 7-14, CS-84-178
NON-PTL 2: IEEE Proceedings of International Conference on Acoustics, Speech and Signal Processing, Vol. 2, 1994, pp. 245-248
NON-PTL 3: IEEE Proceedings of International Conference on Acoustics, Speech and Signal Processing, Vol. 1, 1997, pp. 303-306
NON-PTL 4: IEEE Proceedings of International Conference on Acoustics, Speech and Signal Processing, Vol. 6, 1998, pp. 3677-3680

SUMMARY OF INVENTION

Technical Problem

Each of the methods disclosed in the Patent Literature 3 and the Non-patent Literature 3 is slow in the convergence rate as compared with the signal processing apparatus of the linear coupled type.

Thereupon, the present invention has been accomplished in consideration of the above-mentioned problems, and an object thereof is to provide a signal processing method, a signal processing apparatus, and a signal processing program with an excellent subjective sound quality of the received signals and a short convergence time (a fast convergence rate), wherein the coefficient values of the adaptive filters converge to correct values that are uniquely determined by impulse responses of the echo paths.

Solution to Problem

The present invention is a signal processing method of receiving a plurality of received signals, and subtracting echo replicas generated by a plurality of adaptive filters having said plurality of received signals as an input, respectively, from a plurality of echoes to be generated from said plurality of received signals, thereby to cancel by delaying said plurality of echoes, comprising: generating delayed received signals by delaying two or more of said received signals; and generating echo replicas by inputting said received signals and said delayed received signals into the adaptive filters.

The present invention is a signal processing apparatus for receiving a plurality of received signals, and subtracting echo replicas generated by a plurality of adaptive filters having said plurality of received signals as an input, respectively, from a plurality of echoes to be generated from said plurality of received signals, thereby to cancel by delaying said plurality of echoes, comprising at least: a linear processing circuit for generating delayed received signals by delaying two or more of said received signals; an adaptive filter for generating echo replicas by receiving said received signals and said delayed received signals, and a plurality of subtracters each generating echo-reduced signals by subtracting said echo replicas from said received signals, wherein said signal processing apparatus controlling said plurality of adaptive filters so that outputs of said plurality of subtracters are minimized.

The present invention is a signal processing program for causing a computer to execute: a receiving process of receiving a plurality of received signals; and an echo reducing process of reducing a plurality of echoes that are generated by said plurality of received signals, said signal processing program causing the computer to execute: a delayed received signal generating process of generating delayed received signals by delaying two or more of said received signals; an echo replica generating process of generating echo replicas by inputting said received signals and said delayed received signals into the adaptive filters; and a an echo replica subtracting process of subtracting said echo replicas from said plurality of received signals, respectively.

Advantageous Effect of Invention

The signal processing method, the signal processing apparatus, and the signal processing program of the present invention generate delayed received signals by delaying two received signals or more, respectively, and activate the adaptive filters with the foregoing received signals and the foregoing delayed received signals taken as an input, respectively. The number of conditionals at the moment of obtaining the adaptive filter coefficients is increased because both of the received signal and the delayed received signal are used, and thus, the problem that the solutions become indefinite does not occur. Hence, the adaptive filter coefficients converge to the optimum values that are uniquely determined.

Further, using two delayed received signals or more makes it possible to furthermore increase the number of the foregoing conditionals and to shorten the convergence time of the solutions to the optimum values.

In addition, generating the delayed received signals so that a difference between the left and right channels of the maximum value of a relative delay of the delayed signal in a channel, which is reproduced by each of the left and right loudspeakers located remotest from a center, to the received signal is zero in a status of taking into consideration a bias of the acoustic images due to left-right asymmetry in the arrangement of the foregoing left and right loudspeakers enables shift amounts of the acoustic image localization to the left and the right caused by the delayed received signals to be equalized with each other, and a degradation in the subjective sound quality to be reduced.

DESCRIPTION OF EMBODIMENTS

The embodiments of the present invention will be explained in details by using FIG. 1 to FIG. 16. It is now assumed to use a two-channel acoustic echo canceller having a first received signal, a second received signal, a first mixed signal and a second mixed signal that cancels the acoustic echoes caused by received signals propagating from loudspeakers to microphones via spatial acoustic paths.

Figure 1:
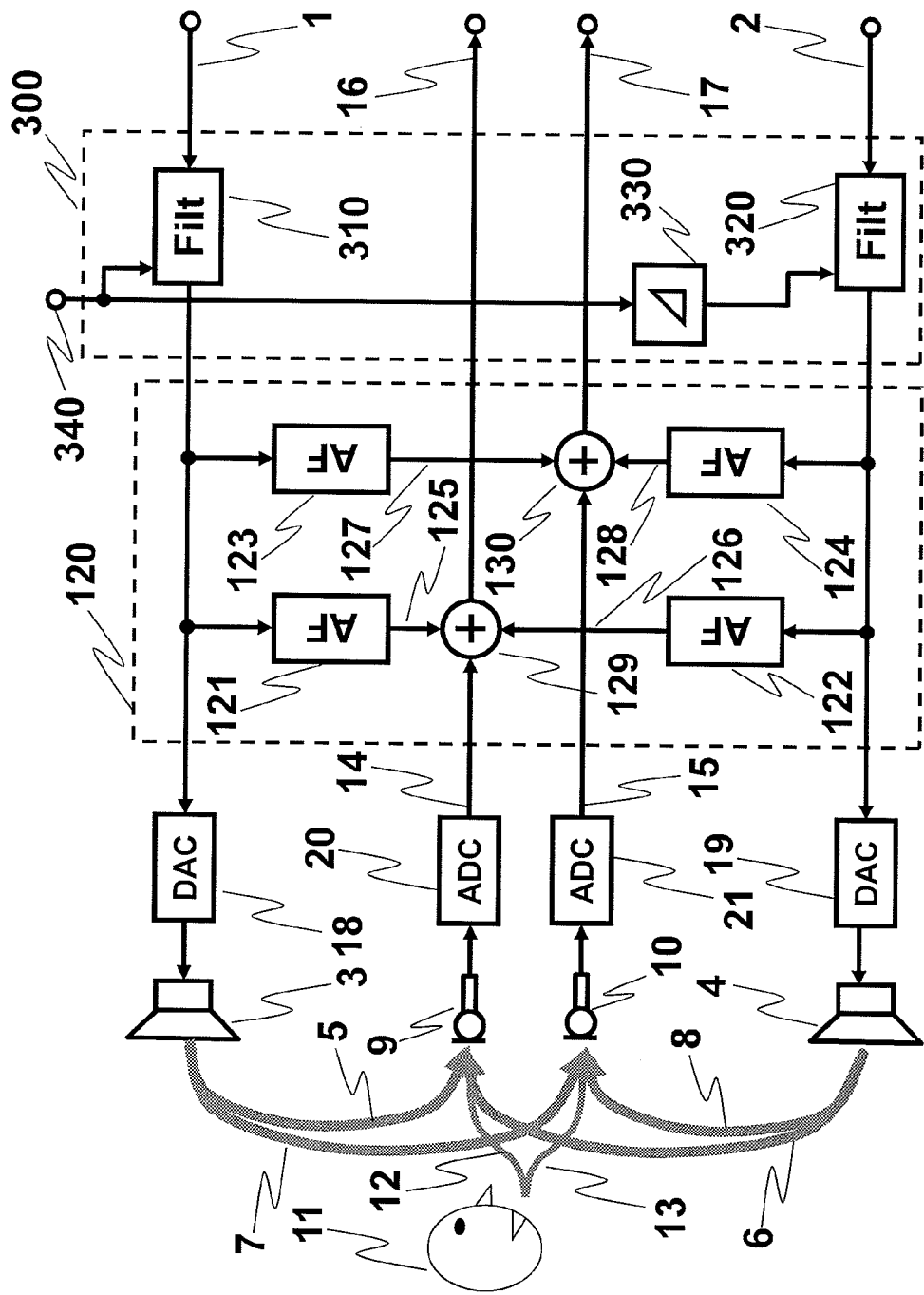
FIG. 1 is a block diagram illustrating a mode of the signal processing apparatus of the present invention.

The signal processing apparatus of the present invention with two received signals and two transmission signals, according to the mode, is shown in FIG. 1. A difference with the apparatus of the linear coupled type disclosed in the Non-patent literature 1 lies in a point that the received signals 1 and 2 to be supplied to adaptive filters 122 and 124 are processed by a delay processing circuit 300.

The received signals 1 and 2 are supplied to the delay processing circuit 300. The delay processing circuit 300 generates the delayed received signals by delaying the received signals 1 and 2, and transmits them to adaptive filters 121 and 123 and a digital-analogue (DA) converter 18 as well as the adaptive filters 122 and 124 and a DA converter 19, respectively. The DA converters 18 and 19 convert the digital delayed received signals into analogue delayed received signals, and transmit them to loudspeakers 3 and 4, respectively. The loudspeakers 3 and 4, upon receipt of the delayed received signals, radiate them into the space. Microphones 9 and 10, upon receipt of a talker 11's voice, and crosstalks (echoes) of the delayed received signals radiated from the loudspeakers 3 and 4 into the spaces, transmits them to analogue-digital (AD) converters 20 and 21 as mixed signals 14 and 15, respectively. The AD converters 20 and 21 convert the mixed signals 14 and 15 from the analogue signals into the digital signals, and transmit them to subtracters 129 and 130. On the other hand, the adaptive filters 121 and 122 as well as the adaptive filters 123 and 124 having received the foregoing delayed received signals generate the pseudo echoes (echo replicas), and transmit them to the subtracters 129 and 130, respectively. The subtracters 129 and 130 subtract the echo replicas generated by the adaptive filters 122 and 122, and the echo replicas generated by the adaptive filters 123 and 124 from the foregoing mixed signals 14 and 15, respectively, and output them as output signals 16 and 17. With the subtraction by the subtracters 129 and 130, the echoes are canceled, and as a result, the output signals 16 and 17 are converted into the signals including no echo.

As algorithm for updating the coefficients of the adaptive filters 121, 122, 123, and 124, the Least Mean Square (LMS) algorithm is disclosed in Non-patent Literature 4 ("Adaptive Signal Processing", 1985, pp. 99-113, Prentice-Hall Inc., USA) and the Normalized Least Mean Square (NLMS) algorithm is disclosed in Non-patent Literature 5 ("Adaptive Filters", 1985, pp. 49-56, Kulwer Academic Publishers, USA).

As algorithm of the adaptive filter, the Sequential Regression Algorithm (SRA) described in the Non-patent Literature 4, and the RLS algorithm described in the Non-patent Literature 5 may be also used.

The delayed signals are intermittently generated in the delay processing circuit 300, and the signals obtained by delaying the received signals 1 and 2, and the signals equal to the received signals 1 and 2, that is, the not-delayed signals coexist in the delayed received signal. The cross correlation between the signals to be supplied to the adaptive filters 121 and 123, and the signals to be supplied to the adaptive filters 122 and 124 differs from each other in these two kinds of the statuses (in a status where the received signals have been delayed and in a status where the received signals have not been delayed). For this, the two kinds of the conditionals (more than the conditionals of the apparatus of the linear coupled type) responding to two kinds of the statuses can be gained, and the coefficients of the adaptive filters 121, 123, 122, and 124 converge to the correct values.

A clock signal is supplied to the delay processing circuit 300 via an input terminal 340. This clock signal is used for controlling a generation timing of the delayed signals in the delay processing circuit 300.

The relative delay amount (relative delay) of the delayed received signal to the received signal can be set to an integer multiple of a sampling period. In this case, the minimum value is equalized to the sampling period. The larger the amount of the relative delay, the larger the cross correlation between the signals to be supplied to the adaptive filters 121 and 123 and the signals to be supplied to the adaptive filters 122 and 124, hence, the convergence time is shortened. However, the movement amount of the acoustic images at the moment that the delayed received signals are reproduced in the loudspeakers 3 and 4 becomes larger, and thus, the subjective sound quality is degraded. For this, the large relative delay is appropriately selected within an allowable range of the movement amount of the acoustic images that are perceived.

The relative delay can be also set to a non-integer multiple of the sampling period. In this case, the more suitable selection is enabled because a fine adjustment is enabled in a selection of the allowable movement amount of the acoustic images and the relative delay that is as large as possible.

The relative delay does not need to be restricted to one kind, and a plurality of values can be also used alternately. For example, the three statuses (two kinds of the relative delays), that is, a status in which the relative delay is a zero multiple of the sampling period (no delay), a status in which the relative delay is a one multiple of the sampling period (a one-sample delay), and a status in which the relative delay is twice as large as the sampling period (a two-sample delay) can be switched. In this case, the number of the foregoing conditionals is three times as large as that of the apparatus of the linear coupled type, and hence, the foregoing adaptive filters can be caused to converge in a far faster rate. As the number of the relative delay amounts that are utilized is increased, the foregoing adaptive filters converge in a fast rate.

The delay processing circuit 300 includes filters 310 and 320, and a clock changing circuit 330. The filter 310 generates the delayed received signal by delaying the received signal 1. The filter 320 generates the delayed received signal by delaying the received signal 2. Each of the filter 310 and the filter 320 can assume a completely identical configuration. The clock changing circuit 330 changes the clock signal supplied to the input terminal 340, and supplies the changed clock signal to the filter 320. A purpose of the clock changing circuit 330 lies in a point of causing the cross correlation between the signal to be supplied to the adaptive filter 121 and 123, and the signal to be supplied to the adaptive filter 122 and 124 to fluctuate with a time by shifting the generation timing of the delayed received signals in the filters 310 and 320. The modification to the phase is simplest as a modification to the clock signal. That is, the supplied clock signal is outputted by adding a delay hereto. As a yet complicated modification to the clock signal, there exists the modification to the period of the clock signal and its change pattern. It is also possible to make the clock signal to be supplied to the input terminal 340 and the clock signal to be supplied to the filter 320 completely different from each other by executing such a complicated modification to the clock signal.

Figure 2:
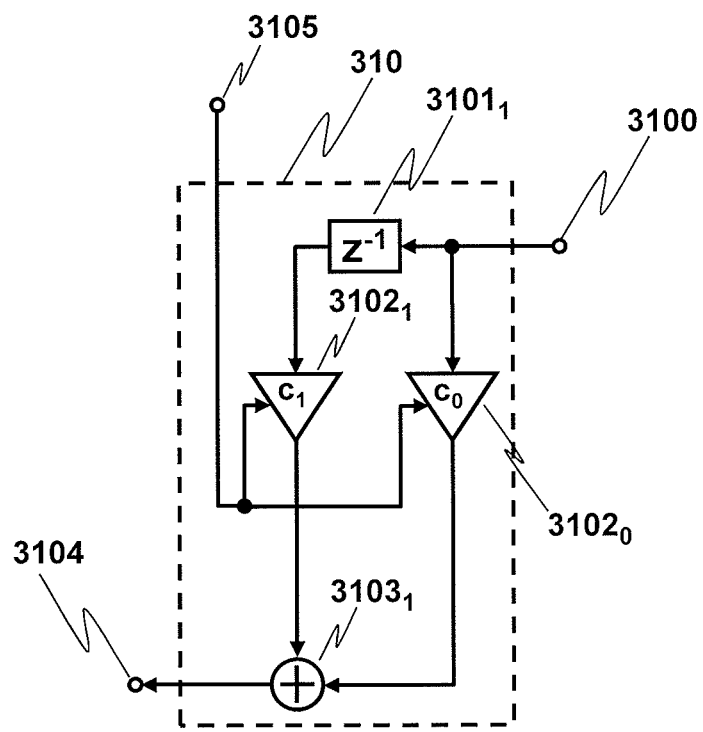
FIG. 2 is a block diagram illustrating an exemplary configuration of filters 310 and 320.

FIG. 2 is a block diagram illustrating an exemplary configuration of the filters 310 and 320. Each filter is configured as a two-tap FIR filter having $c_0$ and $c_1$ as the coefficient. The received signal 1 of FIG. 1 is supplied to an input terminal 3100 of FIG. 2. The signal to be obtained in an output terminal 3104 of FIG. 2 is the delayed received signal.

The signal supplied to the input terminal 3100 is transmitted to a delay element $3101_1$ and a coefficient multiplier $3102_0$. The coefficient multiplier $3102_0$ multiplies the inputted received signal sample by a coefficient value $c_0$ and transmits its product to an adder $3103_1$. The delay element $3101_1$ delays the received signal sample by one sample, and transmits it to a coefficient multiplier $3102_1$.

The coefficient multiplier $3102_1$ multiplies the inputted received signal sample by a coefficient value $c_1$ and transmits its product to an adder $3103_1$. The adder $3103_1$ adds the output of the coefficient multiplier $3102_0$ and the output of the coefficient multiplier $3102_1$, and outputs its sum as the delayed received signal to the output terminal 3104.

The clock signal, which is supplied to an input terminal 3105 from the input terminal 340 of FIG. 1, is transmitted to the coefficient multiplier $3102_0$, and a coefficient multiplier $3102_1$. Based upon the cock signal supplied from the input terminal 3105, each of the coefficient multiplier $3102_0$, and the coefficient multiplier $3102_1$ varies its coefficient value.

The coefficient $c_0$ of the coefficient multiplier $3102_0$ and the coefficient $c_1$ of the coefficient multiplier $3102_1$ vary with a time. So as to clearly express this, $c_0$ and $c_1$ are denoted as $c_0(k)$ and $c_1(k)$, respectively. $c_1(k)$ is given according to the following numerical equation.

$$c_1(k)=1-c_0(k) \qquad \text{<Numerical equation 1>}$$

One example of $c_0(k)$ is shown in FIG. 3(A). i is assumed to be an arbitrary natural number. $c_0(k)$ periodically has 1 and 0 every M (integer) samples. Further, as apparent from the numerical equation 1, $c_1(k)$ varies as represented in the figure that is obtained by reversing FIG. 3(A) up and down. That is, $c_0(k)$ and $c_1(k)$ are exclusive to each other, and either $c_0(k)$ or $c_1(k)$ is zero that is inputted into the adder 3103. Hence, the output of the adder 3103 becomes equal to either the received signal or the delayed received signal, which is equivalent to switching the received signal or the delayed received signal every M samples. Additionally, while the maximum value of $c_0(k)$ can be set to an arbitrary value, the output needs to be scaled by compensating a change in the amplitudes at that moment so that an output identical to the output that is gained when the maximum value of $c_0(k)$ is 1 is yielded.

Figure 3:
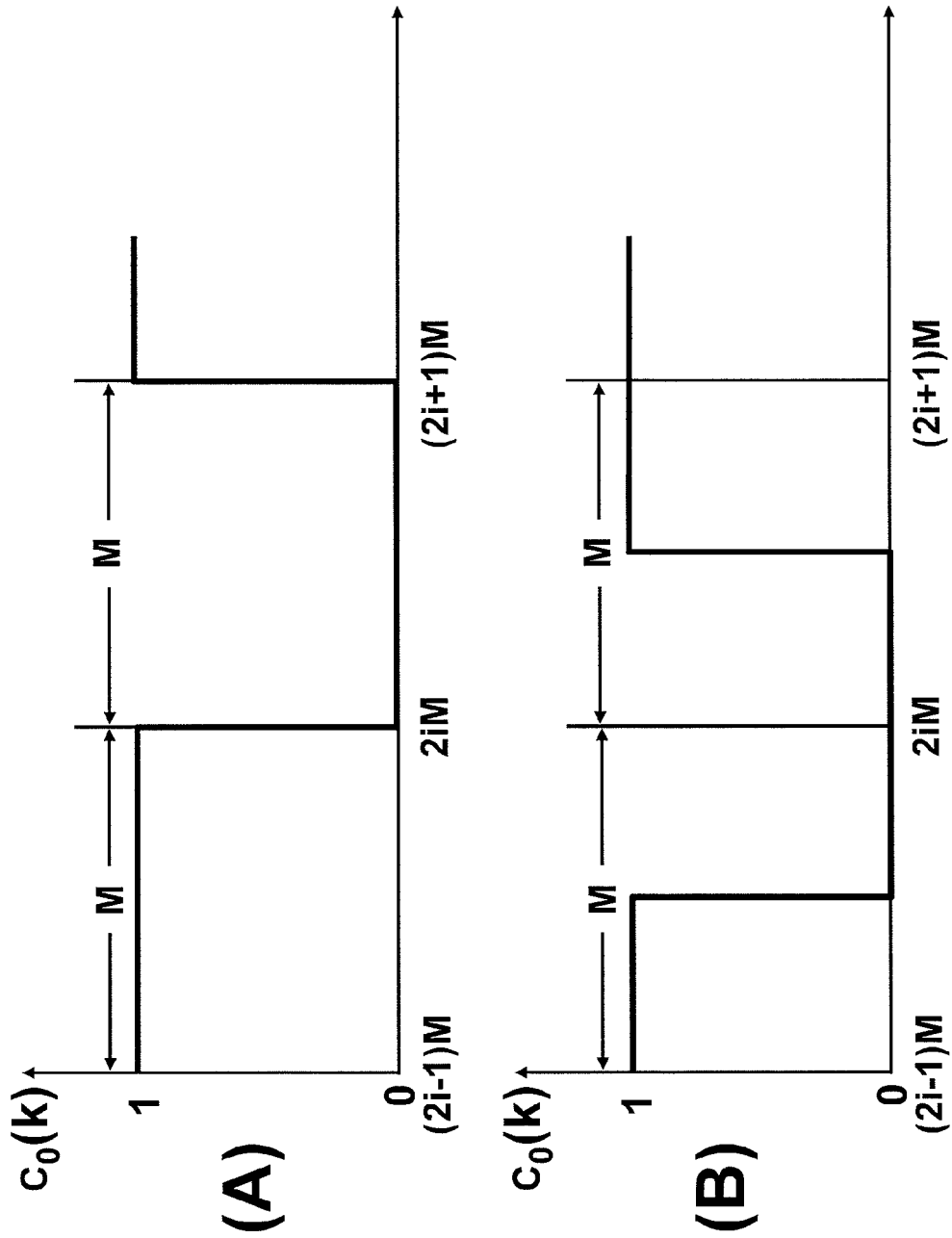
FIG. 3 is a view illustrating an example of a variation in a coefficient $c_0(k)$ in the filters 310 and 320.

FIG. 3(B) shows one example of a variation in $c_0(k)$ of the filter 320 in the case that $c_0(k)$ of the filter 310 varies according to FIG. 3(A). When $c_0(k)$ of the filter 310 and $c_0(k)$ of the filter 320 are varied according to FIGS. 3(A) and (B), respectively, at least a moment that one outputs the received signal and the other outputs the delayed received signal exists. In an example of FIG. 3, the output of the filter 310 is the received signal and the output of the filter 320 is the delayed received signal at M/2 sample just before 2iM. This status is defined as status 1. Further, contrarily, the output of the filter 310 is the delayed received signal and the output of the filter 320 is the received signal at M/2 sample just before (2i+1)M. This status is defined as status 2. The outputs of both of the filters 310 and 320 are the received signals at M/2 sample just after (2i−1)M, and the outputs of both of the filters 310 and 320 are the delayed received signals at M/2 sample just after 2iM. Such a status in which the output of the filter 310 is identical to that of the filter 320 is defined as status 3. The cross correlation between the signal to be supplied to the adaptive filters 121 and 123, and the signal to be supplied to the adaptive filters 122 and 124 in the status 3 is equal to that in the case of the apparatus of the linear coupled type. That is, the cross correlation between the signal to be supplied to the adaptive filters 121 and 123, and the signal to be supplied to the adaptive filters 122 and 124 in the status 3 is equal to that in the case of not utilizing the delayed received signal. Switching this status and the status 1, and updating the adaptive filter coefficients so that two kinds of the cross correlation statuses are simultaneously satisfied enables the adaptive filter coefficients to converge to the correct coefficients. In addition, combining the status 2, and updating the adaptive filter coefficients so that "three kinds of the cross correlation statuses" of the status 1, the status 2, and the status 3 are simultaneously satisfied enables the adaptive filter coefficients to converge to the correct values at a faster rate as compared with the case of utilizing two kinds of the cross correlation statuses.

Particularly, when the maximum value of the relative delay of the output signal of the filter 310 to the output signal of the filter 320 is equal to the maximum value of the relative delay of the output signal of the filter 320 to the output signal of the filter 310, a shift amount of the acoustic image localization to the left caused by the delayed received signal and a shift amount to the right are equalized to each other, and the acoustic images are perceived as if the acoustic images had fluctuated left-right symmetrically with a time. For example, in the above-mentioned status 1 and status 2, the relative delay of the output signal of the filter 310 to the output signal of the filter 320, which is 1, and the relative delay of the output signal of the filter 320 to the output signal of the filter 310, which is 1, are equal to each other. A degradation in the subjective sound quality is smaller with such a left-right symmetrical fluctuation in the acoustic images localization as compared with the asymmetric movement to either the left or the right because the left-right symmetrical fluctuation is perceived as a blur of the acoustic images.

The phase of $c_0(k)$ in FIG. 3(A) and that of $c_0(k)$ in FIG. 3(B) differ from each other by M/2 sample. This shift of the phase could be a value other than M/2 sample. Adjusting this shift of the phase allows the theoretical convergence time to become shortest when the above-mentioned three kinds of the cross correlation statuses appear equally. Further, a period of a variation in $c_0(k)$ does not need to be always equal to M/2 sample, and an arbitrary value can be selected.

Figure 4:
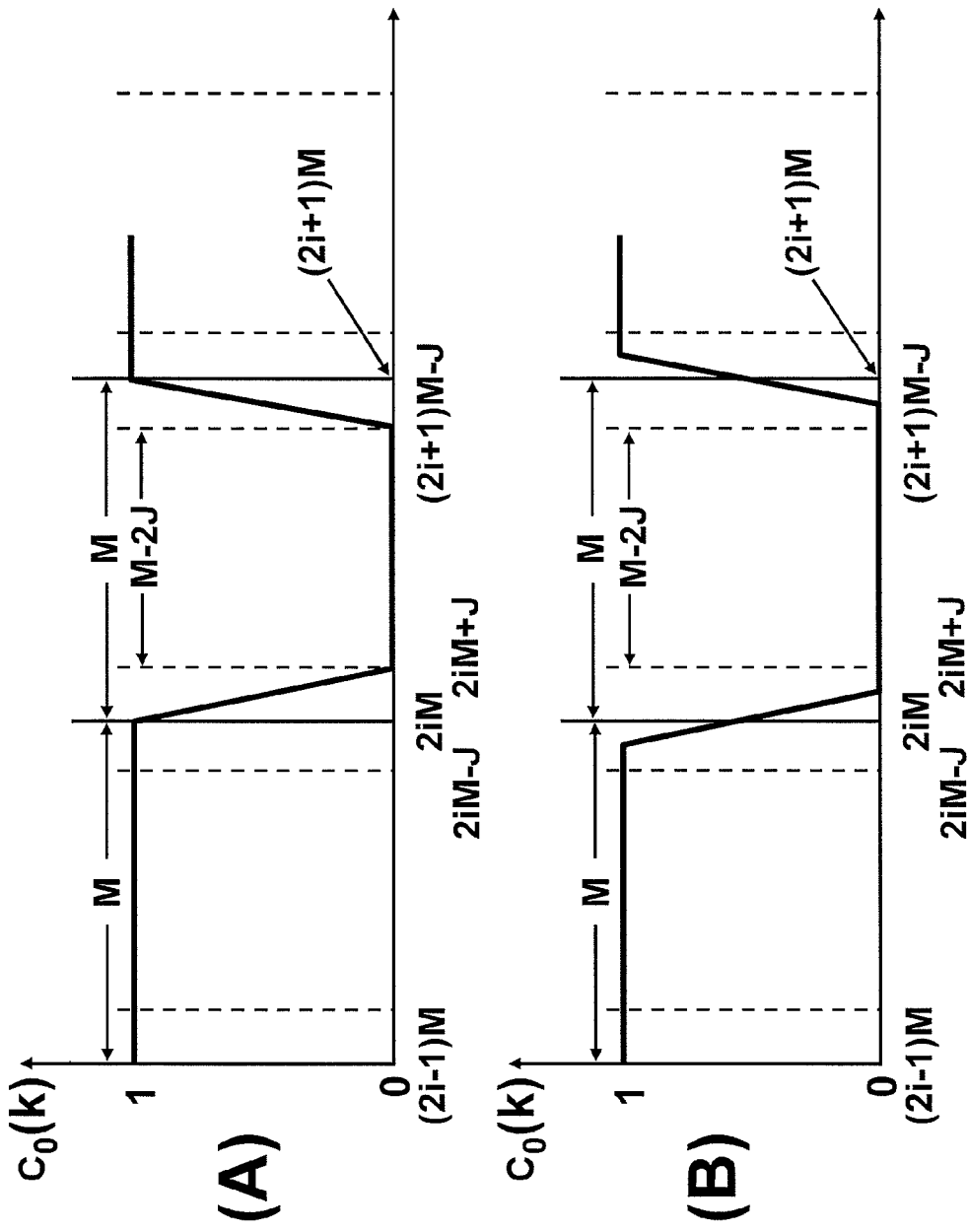
FIG. 4 is a view illustrating another example of a variation in a coefficient $c_0(k)$ in the filters 310 and 320.

Two kinds of the variation patterns of $c_0(k)$ corresponding to FIG. 3(A) are shown in FIGS. 4(A) and (B). In FIG. 4 that differs from FIG. 3, $c_0(k)$ is set so that it does not vary abruptly, but smoothly varies with a long lapse of a time at the moment of varying between a zero value and a non-zero value. A smooth variation in the value yields an effect that the acoustic images that are generated at the moment of mutually switching the received signal and the delayed received signal move smoothly, and the acoustic image movement is hardly perceived. This is effective in improving the subjective sound quality.

Upon comparing FIG. 4 (A) with FIG. 4(B), the time of $c_0(k)=1$ and the time of $c_0(k)=0$ differ from each other. The convergence of the adaptive filter coefficients to the corrective values can be accomplished for a shorter time as the time of $c_0(k)=1$ and the time of $c_0(k)=0$ are longer because the cross correlation between the signal to be supplied to the adaptive filters 121 and 123 and the signal to be supplied to the adaptive filters 122 and 124 most largely differs from that of the apparatus of the linear coupled type when $c_0(k)=1$ and $c_0(k)=0$. In other words, the shorter the section in which the foregoing smooth variation in the value occurs, the shorter the convergence time. On the other hand, it is felt that the movement of the acoustic images is abrupt all the more as the section in which the foregoing smooth variation in the value occurs becomes shorter. Hence, the section in which the foregoing smooth variation in the value occurs is set to have an appropriate length by taking into consideration both of the perception of the acoustic image movement and the convergence time. While FIGS. 4(A) and (B) shows an example where a variation of $c_0(k)$ from $c_0(k)=1$ to $c_0(k)=0$ (or the contrary hereto) is proportional to a time, an arbitrary smooth curved line or straight line for connecting $c_0(k)=1$ and $c_0(k)=0$ can be used.

Figure 5:
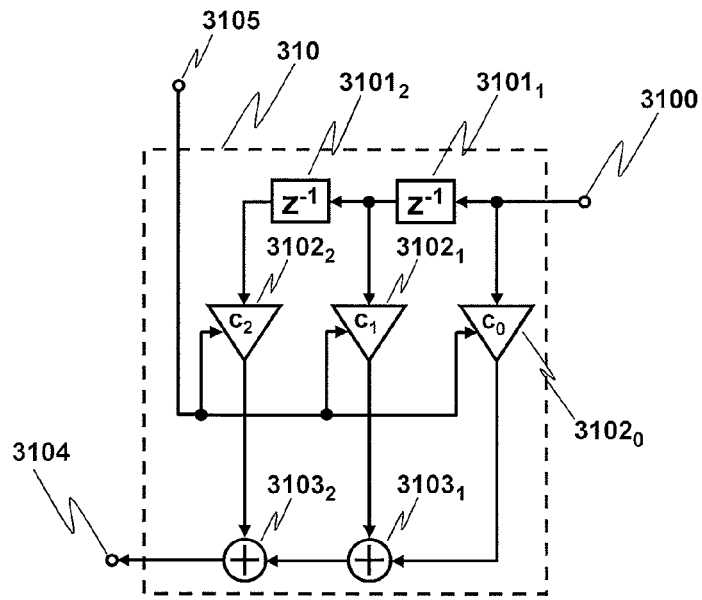
FIG. 5 is a block diagram illustrating a second exemplary configuration of the filters 310 and 320.

FIG. 5 is a block diagram illustrating a second exemplary configuration of the filters 310 and 320. Each filter is configured as a three-tap FIR filter having $c_0$, $c_1$, and $c_2$ as the coefficient. The received signal 1 of FIG. 1 is supplied to an input terminal 3100 of FIG. 5. The signal to be obtained in an output terminal 3104 of FIG. 5 is the delayed received signal.

The signal supplied to the input terminal 3100 is transmitted to a delay element $3101_1$ and a coefficient multiplier $3102_0$.

The coefficient multiplier $3102_0$ multiplies the inputted received signal sample by a coefficient value $c_0$ and transmits its product to an adder $3103_1$. The delay element $3101_1$ delays the received signal sample by one sample, and transmits it to a coefficient multiplier $3102_1$ and a delay element $3101_2$.

The coefficient multiplier $3102_1$ multiplies the output of the delay element $3101_1$ by a coefficient value $c_1$ and transmits its product to an adder $3103_1$. The adder $3103_1$ adds the output of the coefficient multiplier $3102_0$ and the output of the coefficient multiplier $3102_1$, and outputs its sum to an adder $3103_2$. The delay element $3101_2$ delays the output of the delay element $3101_1$ by one sample, and transmits it to a coefficient multiplier $3102_2$.

The coefficient multiplier $3102_2$ multiplies the output of the delay element $3101_2$ by a coefficient value $c_1$ and transmits its product to an adder $3103_2$. The adder $3103_2$ adds the output of the adder $3103_1$ and the output of the coefficient multiplier $3102_2$, and outputs its sum as the delayed received signal to an output terminal 3104.

The clock signal, which is supplied to the input terminal 3105 from the input terminal 340 of FIG. 1, is transmitted to the coefficient multiplier $3102_0$, the coefficient multiplier $3102_1$, and the coefficient multiplier $3102_2$. Based upon the cock signal supplied from the input terminal 3105, each of the coefficient multiplier $3102_0$, the coefficient multiplier $3102_1$, and the coefficient multiplier $3102_2$ varies its coefficient value.

Figure 6:
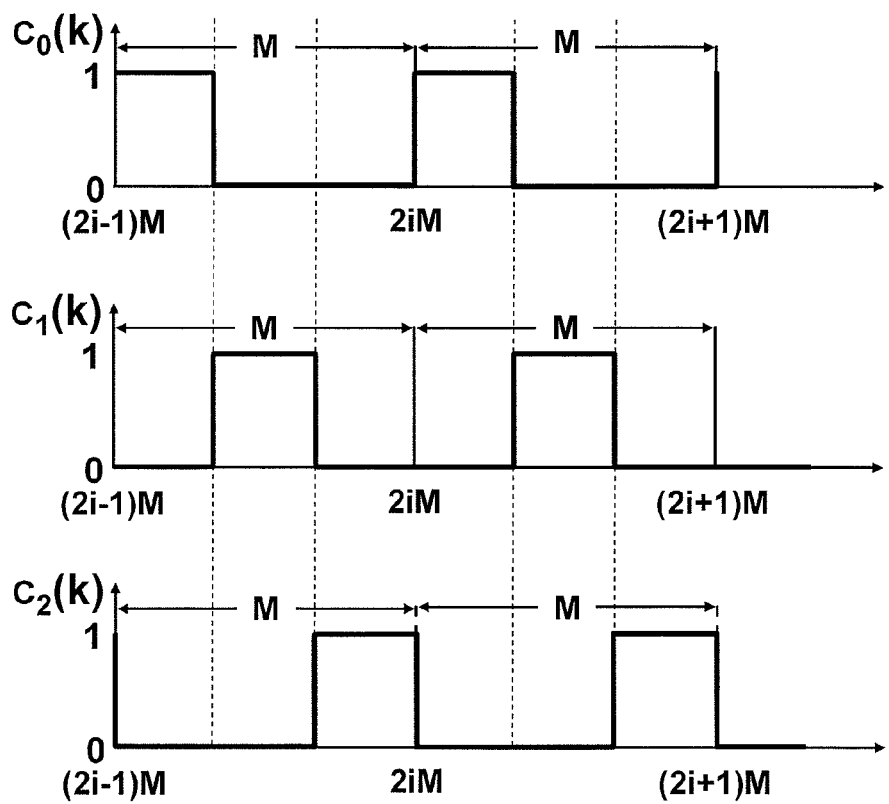
FIG. 6 is a view illustrating an example of a variation in the coefficient $c_0(k)$, a coefficient $c_1(k)$, and a coefficient $c_2(k)$ in the filter 310.

An example of the coefficient $c_0(k)$ of the coefficient multiplier $3102_0$, the coefficient $c_1(k)$ of the coefficient multiplier $3102_1$, and the coefficient $c_2(k)$ of the coefficient multiplier $3102_2$ is shown in FIG. 6. The coefficient $c_0(k)$, the coefficient $c_1(k)$, and the coefficient $c_2(k)$ have 1 exclusively to each other, thereby allowing the received signals subjected to the delay, which correspond to respective coefficient multipliers, to be gained as the delayed received signals in the output terminal 3104. Like FIGS. 4(A) and (B) corresponding to FIG. 3(A), $c_0(k)$, $c_1(k)$, and $c_2(k)$ shown in FIG. 6 can be set so that they smoothly vary at the moment of varying between a zero value and a non-zero value. A smooth variation in the value yields an effect that the acoustic images that are generated at the moment of mutually switching the received signal and the delayed received signal move smoothly, and the acoustic image movement is hardly perceived. This is effective in improving the subjective sound quality.

Further, similarly to the case of the two-tap FIR filter, the foregoing coefficient values can be controlled so that the maximum value of the relative delay of the output signal of the filter 310 to the output signal of the filter 320 is equal to the maximum value of the relative delay of the output signal of the filter 320 to the output signal of the filter 310. Shift amounts of the acoustic image localization to the left and the right caused by the delayed received signals are equalized to each other, and a degradation in the subjective sound quality can be made smaller as compared with the asymmetric movement to either the left or the right.

Figure 7:
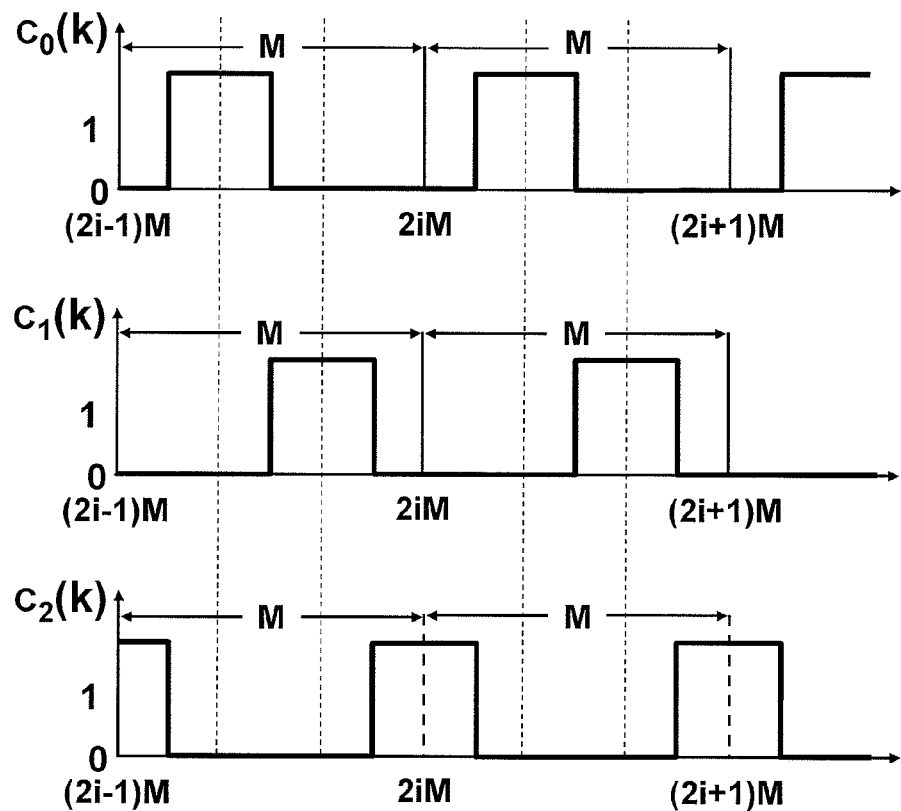
FIG. 7 is a view illustrating an example of a variation in the coefficient $c_0(k)$, the coefficient $c_1(k)$, and the coefficient $c_2(k)$ in the filter 320.

An example of the coefficient $c_0(k)$ of the coefficient multiplier $3102_0$, the coefficient $c_1(k)$ of the coefficient multiplier $3102_1$, and the coefficient $c_2(k)$ of the coefficient multiplier $3102_2$ of the filter 320 corresponding to FIG. 6, is shown in FIG. 7. With a relation between FIG. 6 and FIG. 7, similarly to a relation between FIG. 3(A) and FIG. 3(B), the varying phase of the corresponding coefficient value is shifted. Appropriately setting this shift of the phases makes it possible to change the convergence time. Further, as explained in an example of the two-tap FIR, the coefficient $c_0(k)$ of the coefficient multiplier $3102_0$, the coefficient $c_1(k)$ of the coefficient multiplier $3102_1$, and the coefficient $c_2(k)$ of the coefficient multiplier $3102_2$ can be set so that a variation from non-zero to zero (or the contrary hereto) is proportional to a time in a certain case, and can be set so that they have an arbitrary smooth curved line or straight line for connecting non-zero and zero in another case.

Figure 8:
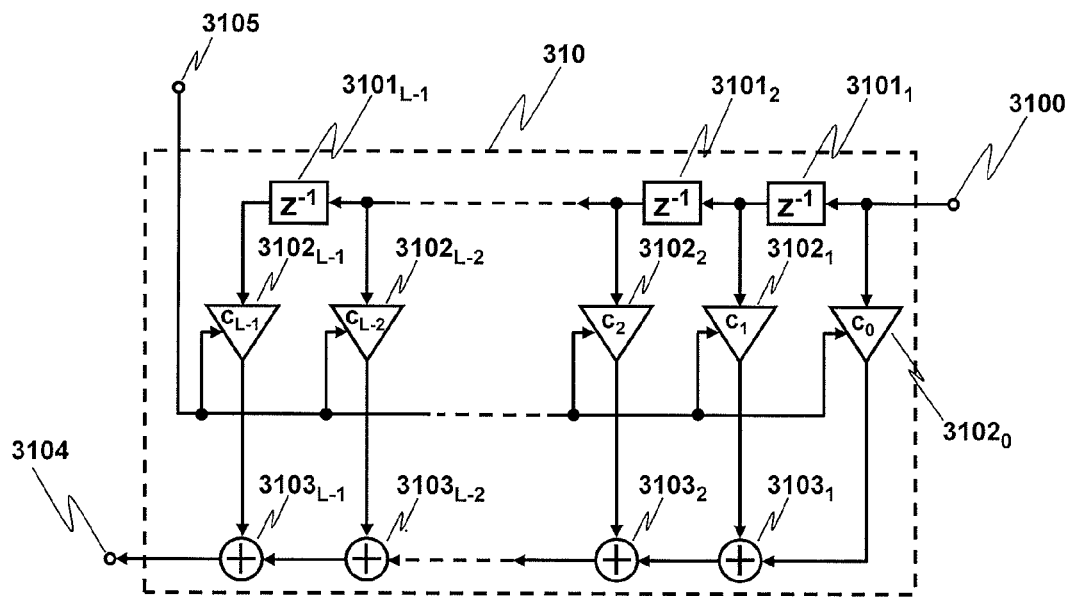
FIG. 8 s a block diagram illustrating a third exemplary configuration of the filters 310 and 320.

FIG. 8 is a block diagram illustrating a third exemplary configuration of the filters 310 and 320. Each filter is configured as an L-tap FIR filter having $c_0, c_1, \ldots, c_{L1}$ as the coefficient. The received signal 1 of FIG. 1 is supplied to an input terminal 3100 of FIG. 8. The signal to be obtained in an output terminal 3104 of FIG. 8 is the delayed received signal.

The signal supplied to the input terminal 3100 is transmitted to a delay element $3101_1$ and a coefficient multiplier $3102_0$.

The coefficient multiplier $3102_0$ multiplies the inputted received signal sample by the coefficient value $c_0$ and transmits its product to an adder $3103_1$. The delay element $3101_1$ delays the received signal sample by one sample, and transmits it to a coefficient multiplier $3102_1$ and a delay element $3101_2$.

The coefficient multiplier $3102_1$ multiplies the output of the delay element $3101_1$ by a coefficient value $c_1$ and transmits its product to an adder $3103_1$. The adder $3103_1$ adds the output of the coefficient multiplier $3102_0$ and the output of the coefficient multiplier $3102_1$, and transmits its sum to an adder $3103_2$. The delay element $3101_2$ delays the output of the delay element $3101_1$ by one sample, and transmits it to a coefficient multiplier $3102_2$. Hereinafter, this processing is repeated up to a coefficient multiplier $3102_{L-2}$.

A coefficient multiplier $3102_{L-1}$ multiplies the output of a delay element $3101_{L-1}$ by a coefficient value $c_{L-1}$ and transmits its product to an adder $3103_{L-1}$. The adder $3103_{L-4}$ adds the output of an adder $3103_{L-2}$ and the output of the coefficient multiplier $3102_{L-1}$, and outputs its sum as the delayed received signal to an output terminal 3104.

The clock signal, which is supplied to an input terminal 3105 from the input terminal 340 of FIG. 1, is transmitted to the coefficient multiplier $3102_0$, the coefficient multiplier $3102_1, \ldots$, and the coefficient multiplier $3102_{L-1}$. Based upon the cock signal supplied from the input terminal 3105, each of the coefficient multiplier $3102_0$, the coefficient multiplier $3102_1$, and, . . . , the coefficient multiplier $3102_{L-1}$ varies its coefficient value.

It may be considered that the coefficient $c_0(k)$ of the coefficient multiplier $3102_0$, the coefficient $c_1(k)$ of the coefficient multiplier $3102_1$, . . . , and the coefficient $c_{L-1}(k)$ of the coefficient multiplier $3102_{L-1}$ correspond to respective taps of the filters 310 and 320 connected in parallel. In other words, the coefficient $c_0(k)$, the coefficient $c_1(k)$, . . . , and the coefficient $c_{L-1}(k)$ have a non-zero value exclusively, and when one coefficient is non-zero, the other coefficients become zero. As explained by using FIG. 3(A) and FIG. 6, $c_0(k)$, $c_1(k)$, . . . , and $c_{L-1}(k)$ have non-zero exclusively to each other, thereby allowing the received signals subjected to the delay, which correspond to respective coefficient multipliers, to be gained as the delayed received signals in the output terminal 3104. Like FIGS. 4(A) and (B) corresponding to FIG. 3(A) as well as and FIG. 7 corresponding to FIG. 6, $c_0(k)$, $c_1(k)$, . . . , and $c_{L-1}(k)$ can be also set so that they smoothly vary at the moment of varying between a zero value and a non-zero value. A smooth variation in the value yields an effect that the acoustic images that are generated at the moment of mutually switching the received signal and the delayed received signal move smoothly, and the acoustic image movement is hardly perceived. This is effective in improving the subjective sound quality.

Also with the case of an L-tap FIR filter as well shown in FIG. 8, as explained by using FIGS. 3(A) and (B), and FIG. 6 and FIG. 7, the phase of $c_0(k)$ in the filter 310 and that of $c_0(k)$ in the filter 320 differ from each other. Appropriately setting this shift of the phases makes it possible to change the convergence time. Further, as explained in an example of the two-tap FIR filter, the coefficient $c_0(k)$ of the coefficient multiplier $3102_0$, the coefficient $c_1(k)$ of the coefficient multiplier $3102_1$, . . . , and the coefficient $c_{L-1}(k)$ of the coefficient multiplier $3102_{L-1}$ can be set so that a variation from non-zero to zero (or the contrary hereto) is proportional to a time in a certain case, and can be set so that they have an arbitrary smooth curved line or straight line for connecting non-zero and zero in another case. In addition, similarly to the case of the two-tap FIR filter and the three-tap FIR filter, the foregoing coefficient values can be controlled so that the maximum value of the relative delay of the output signal of the filter 310 to the output signal of the filter 320 is equal to the maximum value of the relative delay of the output signal of the filter 320 to the output signal of the filter 310. This condition, more generally, makes it possible to express that the maximum values of the relative delays of the delayed signals to the received signals in the channel that are reproduced by the left and right loudspeakers located remotest from a center are equalized to each other. This condition is equivalent to a difference of the maximum value of the relative delay between the left channel and the right channels being zero. When the foregoing left and right loudspeakers are located asymmetrically with respect to the center, the foregoing difference of the maximum value of the relative delay must be zero in a status of taking into consideration a bias of the acoustic images due to its asymmetry.

While the explanation was made so far on the assumption that each of the delay amounts of the delay elements $3101_1$, $3101_2$, . . . , and $3101_{L-1}$ was equal to a one-sampling period, the delay amount may be an integer multiple of the sampling period. Further, respective delay elements may be configured to give different delay amounts, respectively. Not limiting the delay amount of each delay element to the one-sampling period makes it possible to efficiently set the delays of the received signals to different various values, respectively.

Further, while the explanation was made so far on the assumption that the filters 310 and 320 had a configuration of the FIR filter, the filter may have the other structures such as a combination of a variable delay circuit and a switch, and a combination of a variable delay circuit and a variable weighting mixing circuit so long as they have a configuration capable of switching and outputting the received signal and delayed receive signal with a time. Generating a plurality of the delayed received signals by giving different delays to the received signal with a plurality of the variable delay circuits, switching a plurality of these delayed received signals and received signal with the switch in a certain case, and appropriately mixing them with the variable weighting mixing circuit in another case makes it possible to realized a function similar to that of a time-varying-coefficient FIR filter.

As explained above in details, the mode of the present invention generates the delayed received signals by delaying two received signals or more, respectively, and activates the adaptive filters with the foregoing received signals and the foregoing delayed received signals taken as an input, respectively. The number of conditionals at the moment of obtaining the adaptive filter coefficients is increased because both of the received signal and the delayed received signal are used, and thus, the problem that the solutions become indefinite does not occur. Hence, the adaptive filter coefficients converge to the optimum values that are uniquely determined. Further, using a plurality of the delayed received signals makes it possible to furthermore increase the number of the foregoing conditionals and to shorten the convergence time of the solutions to the optimum values. In addition, generating the delayed received signals so that a difference between the left and right channels of the maximum value of a relative delay of the delayed signal in a channel, which is reproduced by each of the left and right loudspeakers located remotest from a center, to the received signal is zero in a status of taking into consideration a bias of the acoustic images due to the left-right asymmetry in the arrangement of the foregoing left and right loudspeakers enables the shift amounts of the acoustic image localization to the left and the right caused by the delayed received signals to be equalized with each other, and a degradation in the subjective sound quality to be made small.

Figure 9:
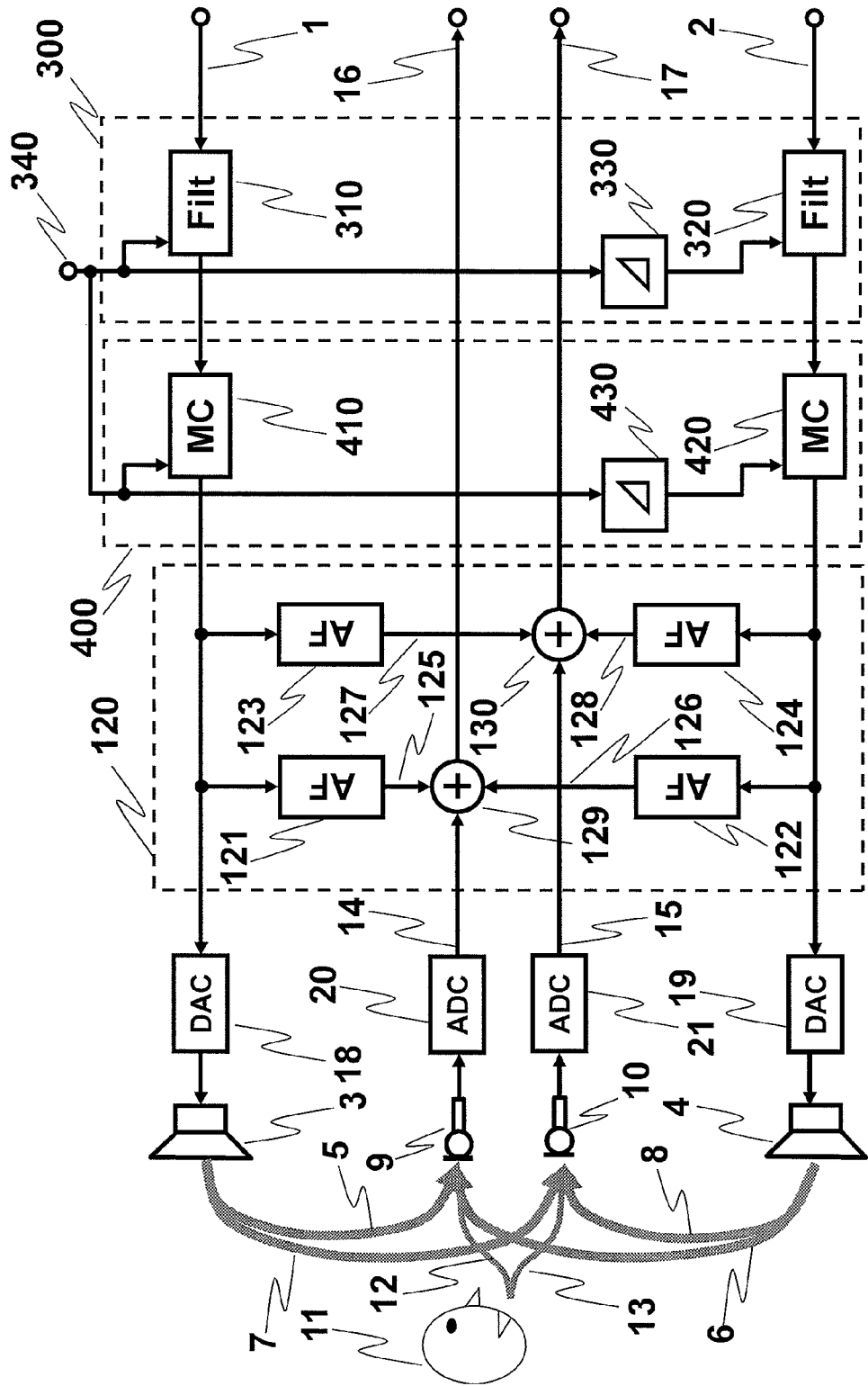
FIG. 9 is a block diagram illustrating a second embodiment of the present invention.

The signal processing apparatus of the present invention with two received signals and two transmission signals, according to the second embodiment, is shown in FIG. 9. A difference with the mode explained by using FIG. 1 and FIG. 8 lies in a point that the output signals of a delay processing circuit 300 are processed by an amplitude correcting circuit 400, and then, supplied to the adaptive filters 121, 123, 122, and 124.

The amplitude correcting circuit 400 generates amplitude-corrected delayed received signals by correcting the amplitudes of the delayed received signals, being outputs of the delay processing circuit 300, and transmits them to the adaptive filters 121 and 123 and the digital-analogue (DA) converter 18 as well as the adaptive filters 122 and 124 and the DA converter 19, respectively.

The amplitude correction of the delayed received signals in the amplitude correcting circuit 400 is performed intermittently to the delay processing in the delay processing circuit 300. The amplitude correction is performed when the delayed received signal is equal to the signal obtained by delaying the received signal 1 or the received signal 2. The amplitude correction makes it possible to correct a correlation of the amplitude of the signal between a plurality of channels, and to cancel the shift of the acoustic image localization generated at the moment of using the delayed received signals instead of the received signals. It is also possible to equalize the total power after the correction to the total power before the correction by compensating for all channels at the moment of the amplitude correction. Maintaining the total power of all channels at a constant level can eliminate the subjective feeling of disorder at the moment that the amplitude-corrected signal and the amplitude-not-corrected signal are switched.

The clock signal is supplied to the amplitude correcting circuit 400 via the input terminal 340. This clock signal is used for applying the amplitude correction according to the timing in which the delayed signals are generated in the delay processing circuit 300.

The amplitude correcting circuit 400 includes amplitude processing circuits 410 and 420 and a clock changing circuit 430. The amplitude processing circuit 410 corrects the amplitude of the delayed received signal generated by delaying the received signal 1, thereby to generate the amplitude-corrected delayed received signal. The amplitude processing circuit 420 corrects the amplitude of the delayed received signal generated by delaying the received signal 2, thereby to generate the amplitude-corrected delayed received signal. Each of the amplitude processing circuits 410 and 420 can assume a completely identical configuration. The clock changing circuit 430, which assumes a configuration completely identical to that of the clock changing circuit 330, operates similarly. For this, detailed explanation is omitted.

Figure 10:
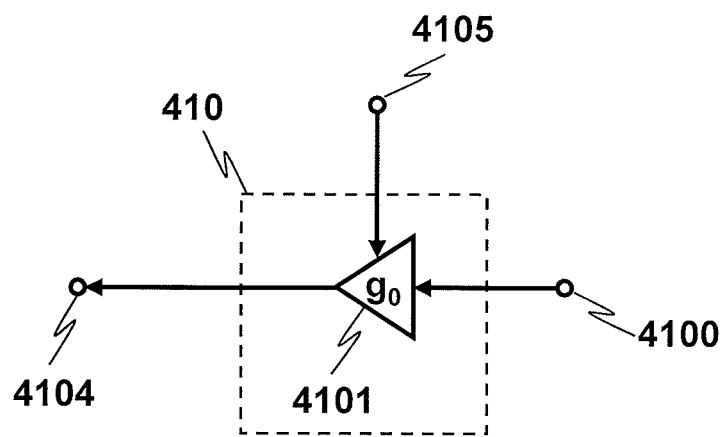
FIG. 10 is a block diagram illustrating an exemplary configuration of an amplitude processing circuit 410.

FIG. 10 is a block diagram illustrating an exemplary configuration of the amplitude processing circuit 410. The amplitude processing circuit 410 is configured as a multiplier 4101 having $g_0$ as a coefficient. The delayed received signal obtained by delaying the received signal 1 is supplied to an input terminal 4100 of FIG. 10. The multiplier 4101 increase the signal supplied to an input terminal 4100 by a factor of $g_0$, and transmits it to an output terminal 4104. The signal to be obtained in the output terminal 4104 of FIG. 10 is the signal obtained by increasing the delayed received signal supplied to the input terminal 4100 by a factor of $g_0$.

The amplitude processing circuit 420 can assume a configuration that is obtained by using $g_1$ instead of $g_0$ as the coefficient of the multiplier 4101 in FIG. 10, being a block diagram illustrating an exemplary configuration of the amplitude processing circuit 410. $g_0$ and $g_1$ have 1 when the received signal 1 and the received signal 2 are supplied to the amplitude processing circuit 410 and the amplitude processing circuit 420, respectively, and otherwise, have a value other than 1 ($g_0$-bar and $g_1$-bar). Such a value for compensating the shift of the acoustic image localization caused by the delayed received signal is set to $g_0$-bar and g-bar. Further, the setting can be also made so that the total power after the correction is equalized to the total power before the correction. Maintaining the total power of all channels at a constant level can eliminate the subjective feeling of disorder at the moment that the amplitude-corrected signal and the amplitude-not-corrected signal are switched.

The amplitude processing circuit 410 and the amplitude processing circuit 420 operate complementarily. That is, the movement of the acoustic images is corrected by $g_0$-bar and $g_1$-bar. The principle of correcting the movement of the acoustic images caused by a change in the delay amount by the amplitude correction is disclosed in Non-patent Literature 6 ("Medical Research Council Special Report", No. 166, 1932, pp. 1-32), Non-patent Literature 7 ("Journal of Acoustical Society of America", Vol. 32, 1960, pp. 685-692), and Non-patent Literature 8 ("Journal of Acoustical Society of America", Vol. 94, 1993, pp. 98-110).

In an example of FIG. 9, when the acoustic images of the acoustic signals to be reproduced for a talker 11 by loudspeakers 3 and 4 move toward the loudspeaker 3, in order to compensate this and to return the acoustic images to an original status, the amplitudes of the signals to be radiated from the loudspeaker 4 in the acoustic space are increased, and simultaneously, the amplitudes of the signals to be radiated from the loudspeaker 3 in the acoustic space are decreased.

According to the Non-patent Literature 8, in order to move the acoustic image by the amplitude correction, with the total power of the received signal 1 and the received signal 2 maintained constant, the following numerical equation 2 must hold between respective powers $P_1$ [dB] and $P_2$ [dB].

$$P_1 + P_2 = C \qquad \text{<Numerical equation 2>}$$

where C is a positive constant. Hence, when the powers of the received signal 1 and the received signal 2 before the amplitude correction are $P_1$-bar[dB] and $P_2$-bar[dB], respectively, the following numerical equation 3 must hold for the powers $P_1$ [dB] and $P_2$ [dB] of the received signal 1 and the received signal 2 after the amplitude correction.

$$P_1 = P_1\text{-bar} - \Delta P/2$$

$$P_2 = P_2\text{-bar} - \Delta P/2 \qquad \text{<Numerical equation 3>}$$

where $\Delta P$ is a power correction amount. For this reason, the values of the coefficients $g_0$-bar and $g_1$-bar of the multiplier 4101 can be determined with the following numerical equation from the numerical equation 3.

$$g_0\text{-bar} = 10^{-\Delta P_i/40}$$

$$g_1\text{-bar} = 10^{\Delta P_i/40} \qquad \text{<Numerical equation 4>}$$

where $\Delta P_i$ is a power compensation coefficient required to compensate the received signals delayed by i samples.

Additionally, in the explanation made so far, according to FIG. 9, the configuration was explained of generating the delayed received signals by processing the received signals with the delay processing circuit 300, generating the amplitude-corrected delayed received signals by correcting the amplitudes of the delayed received signals with the amplitude correcting circuit 400, and supplying them to the adaptive filters 121, 123, 122, and 124. On the other hand, it is also possible to assume the configuration in which the order of the processing of the received signals is exchanged, namely the configuration of generating the amplitude-corrected received signals by correcting the amplitudes of the received signals with the amplitude correcting circuit 400, generating the amplitude-corrected delayed received signals by processing the amplitude-corrected received signals with the delay processing circuit 300, and supplying them to the adaptive filters 121, 123, 122, and 124. Configurations and operations of the delay processing circuit 300 and the amplitude correcting circuit 400 at that moment have been already explained, so its explanation is omitted herein.

As explained above in details, the second embodiment of the present invention generates the delayed received signals by delaying two received signals or more, generates the amplitude-corrected delayed received signals by correcting the amplitudes of the delayed received signals, and activates the adaptive filters with the foregoing received signals and the foregoing amplitude-corrected delayed received signals taken as an input, respectively. The number of conditionals at the moment of obtaining the adaptive filter coefficients is increased because both of the received signal and the amplitude-corrected delayed received signal are used, and thus, the problem that the solutions become indefinite does not occur. Hence, the adaptive filter coefficients converge to the optimum values that are uniquely determined. Further, using a plurality of the delayed received signals makes it possible to furthermore increase the number of the foregoing conditionals and to shorten the convergence time of the solutions to the optimum values. In addition, generating the delayed received signals so that a difference between the left and right channels of the maximum value of a relative delay of the delayed signal in a channel, which is reproduced by each of the left and right loudspeakers located remotest from a center, to the received signal is zero in a status of taking into consideration a bias of the acoustic images due to the left-right asymmetry in the arrangement of the foregoing left and right loudspeakers enables the shift amounts of the acoustic image localization to the left and the right caused by the delayed received signals to be equalized with each other, and a degradation in the subjective sound quality to be made small. Further, a degradation in the sound quality of the audible received signals directly supplied to the loudspeaker is suppressed so that the excellent sound quality can be maintained because the acoustic image movement caused by the introduction of the delayed received signals is offset by the process of correcting the amplitudes of the inputted signals.

Figure 11:
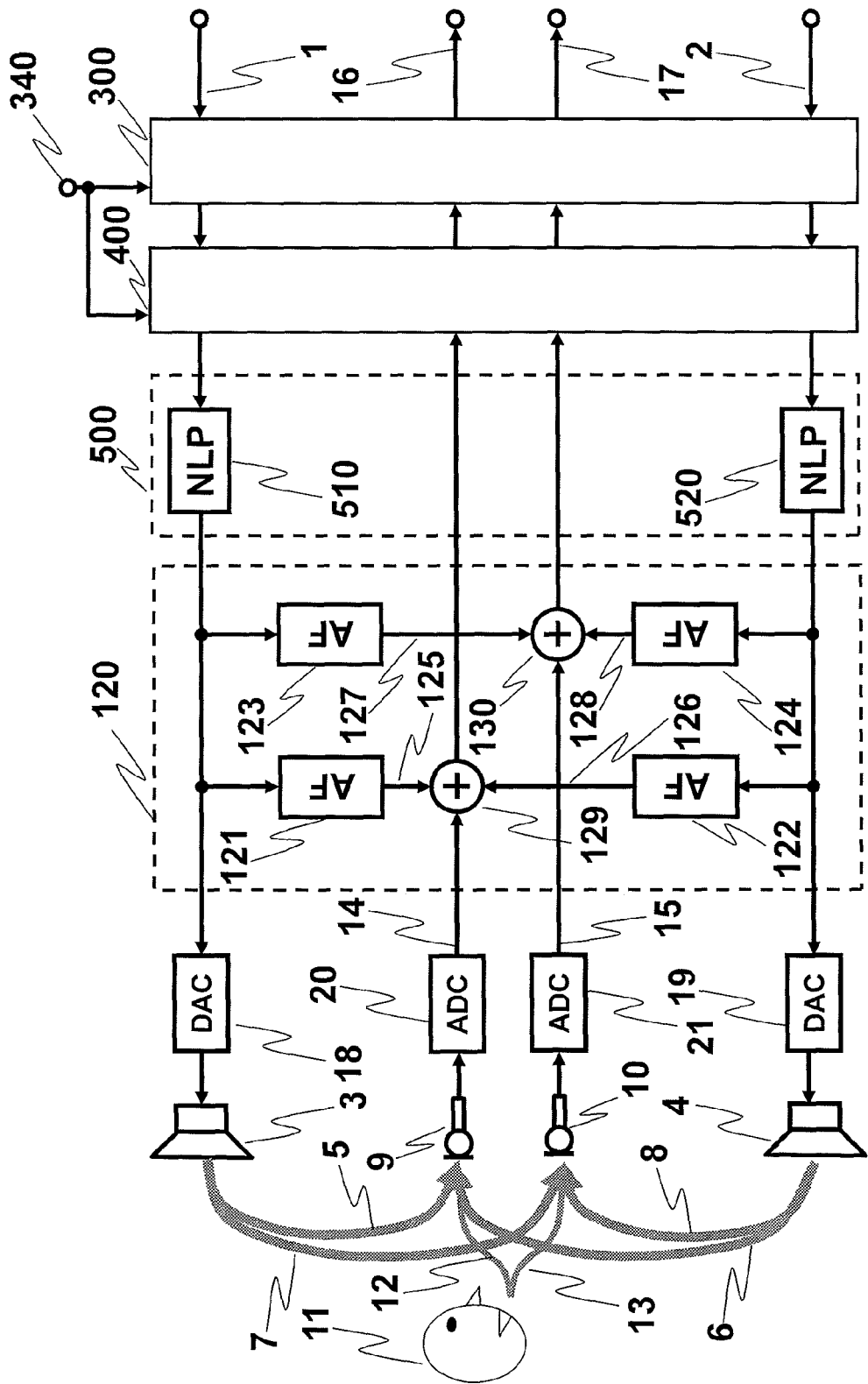
FIG. 11 is a block diagram illustrating a third embodiment of the present invention.

The signal processing apparatus of the present invention with two received signals and two transmission signals, according to the third embodiment, is shown in FIG. 11. A difference with the second embodiment explained by using FIG. 9 and FIG. 10 lies in a point that the output signals of the amplitude correcting circuit 400 are processed by a non-linear processing circuit 500, and then supplied to the adaptive filters 121, 123, 122, and 124.

The non-linear processing circuit 500 generates non-linear amplitude-corrected delayed received signals by non-linearly processing the amplitude-corrected delayed received signals, being outputs of the amplitude correcting circuit 400, and transmits them to the adaptive filters 121 and 123 and the digital-analogue (DA) converter 18 as well as the adaptive filters 122 and 124 and the DA converter 19, respectively. The non-linear amplitude-corrected delayed received signals are smaller in the cross correlation between a plurality of the channels than the amplitude-corrected delayed received signals. Hence, the convergence of the adaptive filters 121, 123, 122, and 124 can be made yet faster.

The non-linear processing circuit 500 includes non-linear amplitude processing circuits 510 and 520. The non-linear amplitude processing circuit 510 non-linearly processes the amplitude of the amplitude-corrected delayed received signal obtained by delaying the received signal 1 and then correcting the amplitude thereof, thereby to generate the non-linear amplitude-corrected delayed received signal. The non-linear amplitude processing circuit 520 non-linearly processes the amplitude of the amplitude-corrected delayed received signal obtained by delaying the received signal 2 and then correcting the amplitude thereof, thereby to generate the non-linear amplitude-corrected delayed received signal. Each of the non-linear amplitude processing circuits 510 and 520 can assume a completely identical configuration.

Figure 12:
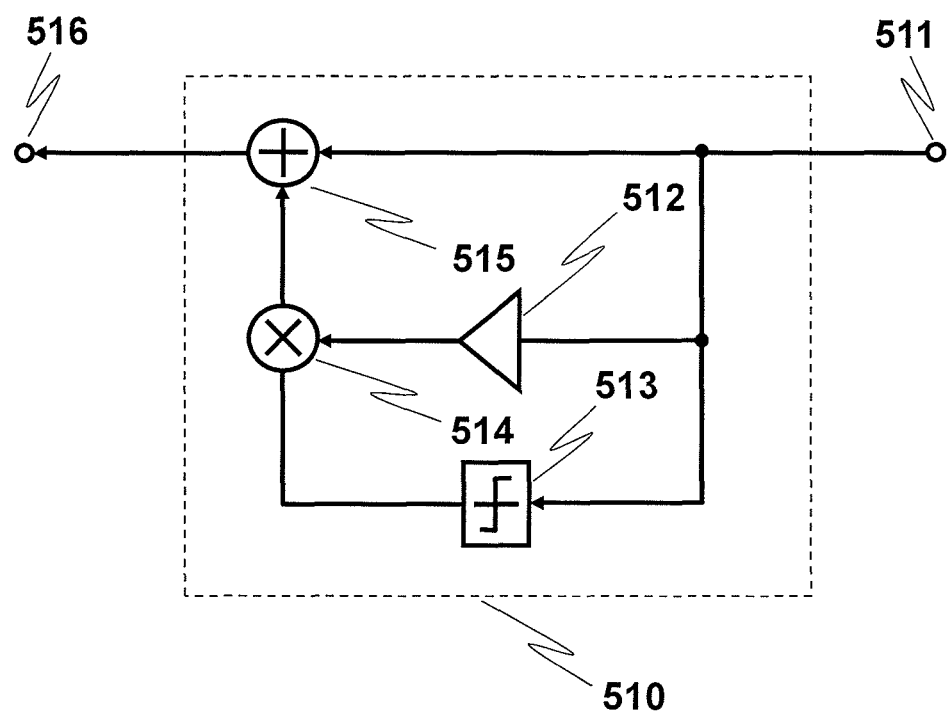
FIG. 12 is a block diagram illustrating an exemplary configuration of a non-linear amplitude processing circuit 510.

FIG. 12 is a block diagram illustrating an exemplary configuration of the non-linear amplitude processing circuit 510. The non-linear amplitude processing circuit 510 is configured of a coefficient multiplier 512, a polarity determining circuit 513, a multiplier 514, and an adder 515. The amplitude-corrected delayed received signals, being outputs of the amplitude correcting circuit 400 of FIG. 11, are supplied to an input terminal 511. The amplitude-corrected delayed received signals are transmitted to the coefficient multiplier 512, the polarity determining circuit 513, and the adder 515. The coefficient multiplier 512 increases its input signal by a factor of α, and outputs it. The polarity determining circuit 513 outputs 1 when the polarity of the signal supplied to the input is positive, and outputs 0 when it is negative. The multiplier 514, to which the output of the coefficient multiplier 512 and the output of the polarity determining circuit 513 are supplied, transmits a product of both to the adder 515. The amplitude-corrected delayed received signals are supplied to another input terminal of the adder 515 as they stand. That is, it follows that the output of the adder 515 for a signal sample x(k) in an input terminal 511 is (1+α)x(k) when the polarity of the input signal is positive, and is x(k) when it is negative. This signal becomes the output signal of the non-linear amplitude processing circuits 510. That is, the non-linear amplitude processing circuits 510 constitutes a half-wave rectifier circuit. The non-linear amplitude processing circuits 520 can assume a configuration completely identical to that of the non-linear amplitude processing circuits 510.

Additionally, in the explanation made so far, according to FIG. 11, the configuration was explained of generating the delayed received signals by processing the received signals with the delay processing circuit 300, generating the amplitude-corrected delayed received signals by correcting the amplitudes of the delayed received signals with the amplitude correcting circuit 400, generating the non-linear amplitude-corrected delayed received signals by processing the amplitude-corrected delayed received signals with the non-linear processing circuit 500, and supplying them to the adaptive filters 121, 123, 122, and 124. On the other hand, it is also possible to assume the configuration in which the order of the processing of the received signals is exchanged, namely the configuration of, after processing the received signals in the order of the amplitude correction, the delay, and the non-linear processing, or in the order of the non-linear processing, the delay, and the amplitude correction, supplying them to the adaptive filters 121, 123, 122, and 124. Configurations and operations of the delay processing circuit 300, the amplitude correcting circuit 400, and the non-linear processing circuit 500 at that moment have been already explained, so its explanation is omitted herein.

As explained above in details, the third embodiment of the present invention generates the delayed received signals by delaying two received signals or more, generates the amplitude-corrected delayed received signals by correcting the amplitudes of the delayed received signals, generates the non-linear amplitude-corrected delayed received signals by non-linearly processing the amplitude-corrected delayed received signals, and activates the adaptive filters with the foregoing received signals and the foregoing non-linear amplitude-corrected delayed received signals taken as an input, respectively. The number of conditionals at the moment of obtaining the adaptive filter coefficients is increased because both of the received signal and the non-linear amplitude-corrected delayed received signal are used, and thus, the problem that the solutions become indefinite does not occur. Hence, the adaptive filter coefficients converge to the optimum values that are uniquely determined. Further, using a plurality of the delayed received signals makes it possible to furthermore increase the number of the foregoing conditionals and to shorten the convergence time of the solutions to the optimum values. In addition, generating the delayed received signals so that a difference between the maximum values of the relative delays of the delayed signals to the received signals in the left and right channel that are reproduced by the left and the right loudspeakers located remotest from a center, respectively, is zero in a status of taking into consideration a bias of the acoustic images due to the left-right asymmetry in the arrangement of the foregoing left and right loudspeakers enables the shift amounts of the acoustic image localization to the left and the right caused by the delayed received signals to be equalized with each other, and a degradation in the subjective sound quality to be made small. Further, a degradation in the sound quality of the audible received signals directly supplied to the loudspeaker is suppressed so that the excellent sound quality can be maintained because the acoustic image movement caused by the introduction of the delayed received signals is offset by the process of correcting the amplitudes of the inputted signals. In addition, the convergence time can be shortened all the more by a synergistic effect of the non-linear processing and the introduction of the delayed received signals.

Figure 13:
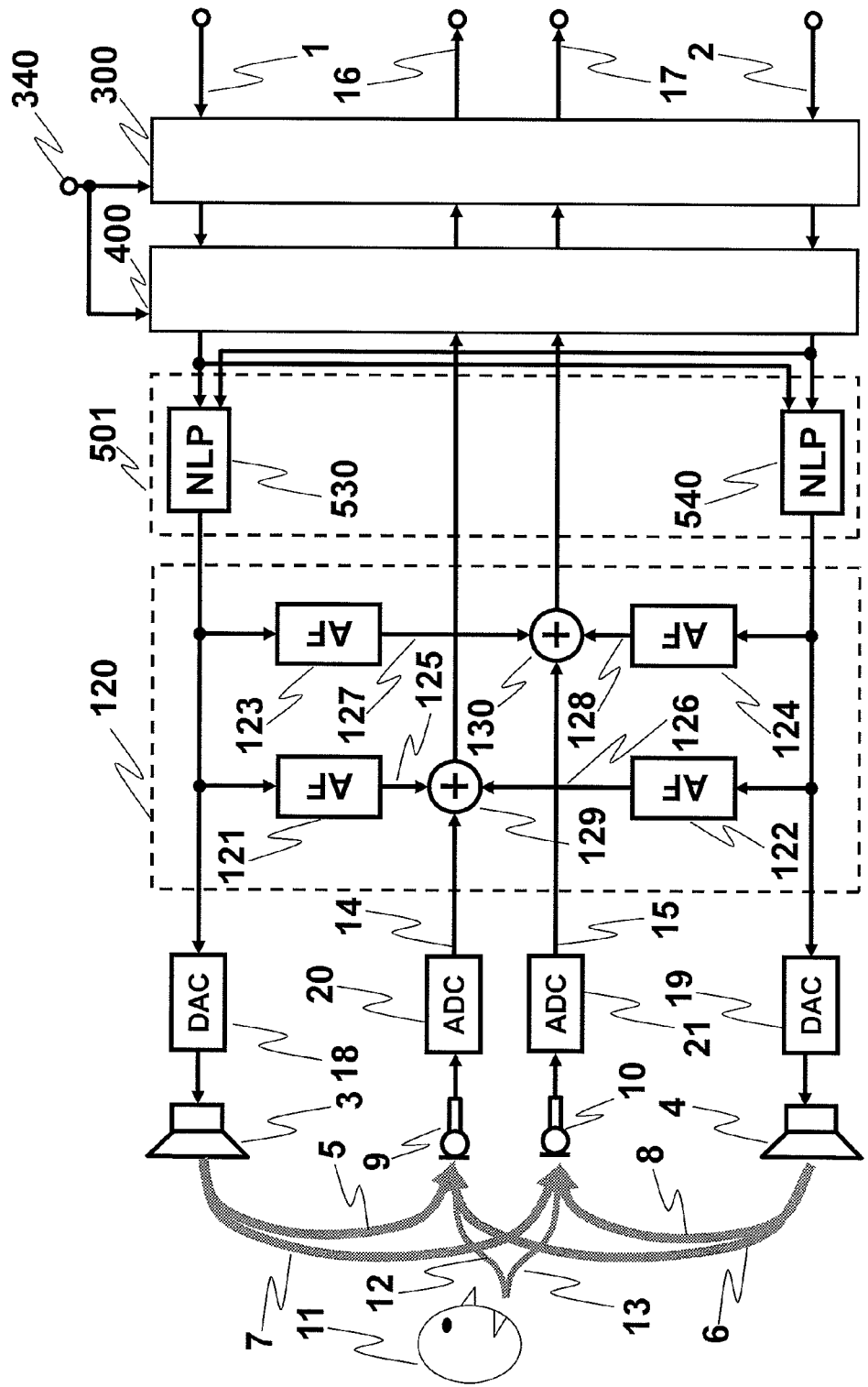
FIG. 13 is a block diagram illustrating a fourth embodiment of the present invention.

The signal processing apparatus of the present invention with two received signals and two transmission signals, according to the fourth embodiment, is shown in FIG. 13. A difference with the third embodiment explained by using FIG. 11 and FIG. 12 lies in a point that the non-linear processing circuit 500 is replaced with a non-linear processing circuit 501.

The non-linear processing circuit 501 includes non-linear amplitude processing circuits 530 and 540. The non-linear amplitude processing circuit 530 non-linearly processes the amplitude-corrected delayed received signal obtained by delaying the received signal 1 and then correcting the amplitude thereof by using the amplitude-corrected delayed received signal obtained by delaying the received signal 2 and then correcting the amplitude thereof, thereby to generate the non-linear amplitude-corrected delayed received signals. The non-linear amplitude processing circuit 540 non-linearly processes the amplitude-corrected delayed received signal obtained by delaying the received signal 2 and then correcting the amplitude thereof by using the amplitude-corrected delayed received signal obtained by delaying the received signal 1 and then correcting the amplitude thereof, thereby to generate the non-linear amplitude-corrected delayed received signals. Each of the non-linear amplitude processing circuits 530 and 540 can assume a completely identical configuration.

Figure 14:
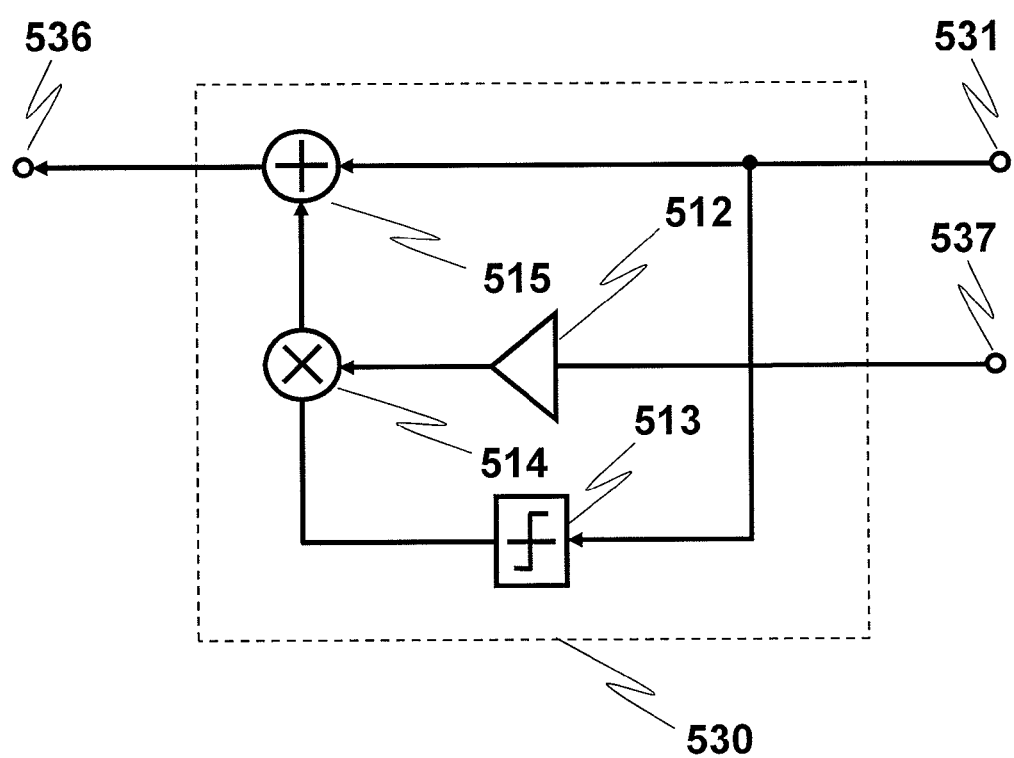
FIG. 14 is a block diagram illustrating an exemplary configuration of a linear amplitude processing circuit 530.

FIG. 14 is a block diagram illustrating an exemplary configuration of the non-linear amplitude processing circuit 530. The non-linear amplitude processing circuit 530 is configured of a coefficient multiplier 512, a polarity determining circuit 513, a multiplier 514, and an adder 515. The amplitude-corrected delayed received signal obtained by delaying the received signal 1 and then correcting the amplitude thereof, out of the outputs of the amplitude correcting circuit 400 of FIG. 13, is supplied to an input terminal 531. The amplitude-corrected delayed received signal obtained by delaying the received signal 2 and then correcting the amplitude thereof, out of the outputs of the amplitude correcting circuit 400 of FIG. 13, is supplied to an input terminal 537. The amplitude-corrected delayed received signal generated from the received signal 1 is transmitted to the polarity determining circuit 513 and the adder 515. The amplitude-corrected delayed received signal generated from the received signal 2 is transmitted to the coefficient multiplier 512. The coefficient multiplier 512 increases its input signal by a factor of $\alpha$, and outputs it. The polarity determining circuit 513 outputs 1 when the polarity of the signal supplied to the input is positive, and outputs 0 when it is negative. The multiplier 514, to which the output of the coefficient multiplier 512 and the output of the polarity determining circuit 513 are supplied, transmits a product of both to the adder 515. The amplitude-corrected delayed received signal generated from the received signal 1 is supplied to another input terminal of the adder 15 as it stands. That is, it follows that the output of the adder 515 for a signal sample $x_1(k)$ in an input terminal 531 and for a signal sample $x_2(k)$ in an input terminal 537 is $x_1(k)+\alpha x_2(k)$ when the polarity of the input signal is positive, and is $x_1(k)$ when it is negative. This signal becomes the output signal of the non-linear amplitude processing circuits 530. The non-linear amplitude processing circuits 530 has the configuration in which the input of the coefficient multiplier 512 in the non-linear amplitude processing circuits 510 has been changed from the amplitude-corrected delayed received signal generated from the received signal 1 to the amplitude-corrected delayed received signal generated from the received signal 2. In this configuration, the variation from the signal not subjected to the non-linear processing becomes large and an effect of reducing the correlation between the channels becomes large because the signal generated from the received signal of another channel is used for the non-linear processing. The non-linear amplitude processing circuits 540 can assume a configuration completely identical to that of the non-linear amplitude processing circuits 530.

Additionally, in the explanation made so far, according to FIG. 13, the configuration was explained of generating the delayed received signals by processing the received signals with the delay processing circuit 300, generating the amplitude-corrected delayed received signals by correcting the amplitudes of the delayed received signals with the amplitude correcting circuit 400, generating the non-linear amplitude-corrected delayed received signals by processing the amplitude-corrected delayed received signals with the non-linear amplitude processing circuit 501, and supplying them to the adaptive filters 121, 123, 122, and 124. On the other hand, it is also possible to assume the configuration in which the order of the processing of the received signals is exchanged, namely the configuration of, after processing the received signals in the order of the amplitude correction, the delay, and the non-linear processing, or in the order of the non-linear processing, the delay, and the amplitude correction, supplying them to the adaptive filters 121, 123, 122, and 124. Configurations and operations of the delay processing circuit 300, the amplitude correcting circuit 400, and the non-linear processing circuit 501 at that moment have been already explained, so its explanation is omitted herein.

As explained above in details, the fourth embodiment of the present invention generates the delayed received signals by delaying two received signals or more, generates the amplitude-corrected delayed received signals by correcting the amplitudes of the delayed received signals, generates the non-linear amplitude-corrected delayed received signals by non-linearly processing the amplitude-corrected delayed received signals, and activates the adaptive filters with the foregoing received signals and the foregoing non-linear amplitude-corrected delayed received signals taken as an input, respectively. The number of conditionals at the moment of obtaining the adaptive filter coefficients is increased because both of the received signal and the non-linear amplitude-corrected delayed received signal are used, and thus, the problem that the solutions become indefinite does not occur. Hence, the adaptive filter coefficients converge to the optimum values that are uniquely determined. Further, using a plurality of the delayed received signals makes it possible to furthermore increase the number of the foregoing conditionals and to shorten the convergence time of the solutions to the optimum values. In addition, generating the delayed received signals so that a difference between the left and right channels of the maximum value of a relative delay of the delayed signal in a channel, which is reproduced by each of the left and right loudspeakers located remotest from a center, to the received signal is zero in a status of taking into consideration a bias of the acoustic images due to the left-right asymmetry in the arrangement of the foregoing left and right loudspeakers enables the shift amounts of the acoustic image localization to the left and the right caused by the delayed received signals to be equalized with each other, and a gradation in the subjective sound quality to be made small. Further, a degradation in the sound quality of the audible received signals directly supplied to the loudspeaker is suppressed so that the excellent sound quality can be maintained because the acoustic image movement caused by the introduction of the delayed received signals is offset by the process of correcting the amplitudes of the inputted signals. In addition, the convergence time can be shortened all the more by a synergistic effect of the non-linear processing using the received signals of a plurality of channels and the introduction of the delayed received signals.

Figure 15:
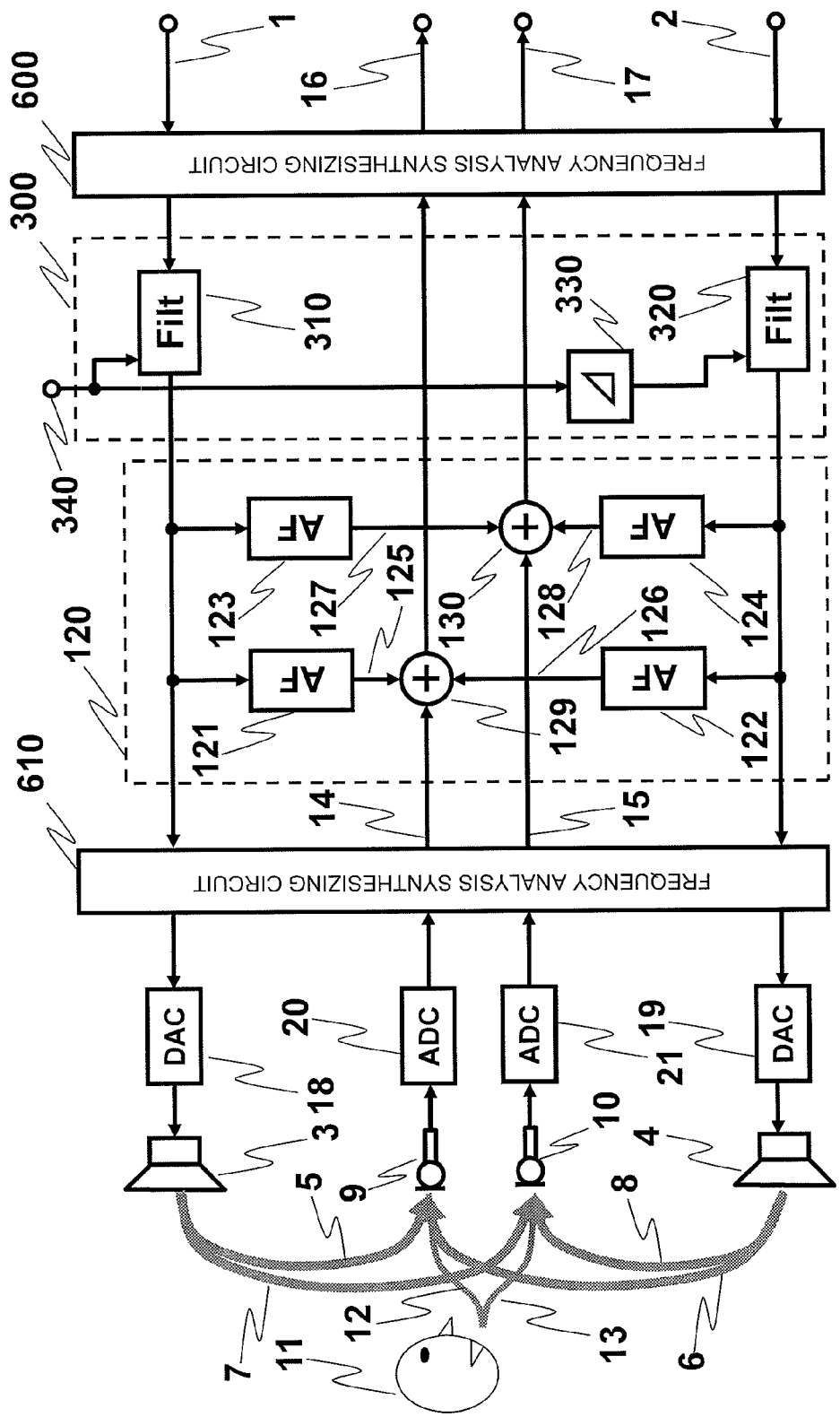
FIG. 15 is a block diagram illustrating a fifth embodiment of the present invention.

The signal processing apparatus of the present invention with two received signals and two transmission signals, according to the fifth embodiment, is shown in FIG. 15. A difference with the first embodiment explained by using FIG. 1 and FIG. 8 lies in a point that a frequency analysis synthesizing circuit 600 is provided upstream of the delay processing circuit 300, and that a frequency analysis synthesizing circuit 610 is provided upstream of the DA converters 18 and 19 as well as downstream of the AD converters 20 and 21. Hence, all of the delay processing circuit 300, the adapter filters 121, 122, 123, and 124, and the subtracters 129 and 130 are operative in response to band-divided narrow band signals. The frequency analysis synthesizing circuit 600 band-divided the received signals 1 and 2, and transmits them to the delay processing circuit 300. The frequency analysis synthesizing circuit 600 also band-synthesizes the outputs of the subtracters 129 and 130, and constitutes all-band output signals 16 and 17. The frequency analysis synthesizing circuit 610 band-synthesizes the outputs of the delay processing circuit 300, and transmits them to the DA converters 18 and 19. The frequency analysis synthesizing circuit 610 also band-divides the outputs of the AD converters 20 and 21, and transmits them to the subtracters 129 and 130. The delay processing circuit 300 adds the delays to the band-divided signals, and outputs them as band-divided delayed received signals. The fifth embodiment enables the optimum delays to be given to the band-divided signals, respectively. Hence, it leads to an increase in a degree of freedom at the moment of selecting the relative delay that is as large as possible within the allowable movement amount of the acoustic images, and an improvement in the subjective sound quality, which was explained by using FIG. 1.

The frequency analysis function of the frequency analysis synthesizing circuits 600 and 610 can be realized by applying a frequency conversion for the input signal sample divided into the frames. As an example of the frequency conversion, a Fourier transform, a cosine transform, a KL (Karhunen Loeve) transform, etc. are known. The technology related to a specific arithmetic operation of these transforms, and its properties are disclosed in Non-patent Literature 9 (DIGITAL CODING OF WAVEFORMS, PRINCIPLES AND APPLICATIONS TO SPEECH AND VIDEO, PRENTICE-HALL, 1990). Further, it is publicly known that other conversions such as a Hadamard transform, a Haar transform, and a wavelet transform can be used.

The foregoing frequency analysis function can be also realized by applying the foregoing transforms for a result obtained by weighting the input signal samples of the above frame with a window function W. As such a window function, the window functions such as a Hamming window, a Hanning (Hann) window, a Kaiser window, and a Blackman window are known. Further, more complicated window functions also can be used. The technology related to these window functions is disclosed in Non-patent Literature 10 (DIGITAL SIGNAL PROCESSING, PRENTICE-HALL, 1975) and Non-patent Literature 11 (MULTIRATE SYSTEMS AND FILTER BANKS, PRENTICE-HALL, 1993). In addition, the windowing as well by partially overlapping two continuous frames or more is widely carried out. In this case, the foregoing frequency transforms are used for the signal subjected to the overlap windowing. The technology related to the blocking involving the overlap and the conversion is disclosed in the Non-patent Literature 10.

In addition, the frequency analysis function of the frequency analysis synthesizing circuits 600 and 610 may be configured of a band-division filter bank. The band-division filter bank is configured of a plurality of band-pass filters. An interval of each frequency band of the band-division filter bank could be equal in a certain case, and unequal in another case. Carrying out the band division at an unequal interval makes it possible to lower/raise a time resolution, that is, the time resolution can be lowered by carrying out the division into narrows bands with regard to a low-frequency area, and the time resolution can be raised by carrying out the division into wide bands with regard to a high-frequency area. As a typified example of the unequal-interval division, there exists an octave division in which the band gradually halves toward the low-frequency area, a critical band division that corresponds to an auditory feature of a human being, or the like. After dividing into the frequency bands having an equal interval, a hybrid filter bank may be used for furthermore carrying out the band division only with regard to a low-frequency area in order to enhance the frequency resolution of the frequency bands in a low-frequency area. The technology related to the band-division filter bank and its design method is disclosed in the Non-patent Literature 11.

The frequency synthesis function of the frequency analysis synthesizing circuits 600 and 610 is preferably configured of an inverse conversion corresponding to the frequency conversion for realizing the frequency analysis function of the frequency analysis synthesizing circuits 600 and 610. When the frequency analysis function of the frequency analysis synthesizing circuits 600 and 610 includes the weighting by a window function W, the frequency-synthesized signals are multiplied by the window function W. When the frequency analysis function of the frequency analysis synthesizing circuits 600 and 610 is configured of the band-division filter bank, the frequency synthesis function of the frequency analysis synthesizing circuits 600 and 610 is configured of a band-synthesis filter bank. The technology related to the band-synthesis filter bank and its design method is disclosed in the Non-patent Literature 11.

Additionally, it is self-evident that a processing similar to the processing so far explained can be performed for the band-divided signals by combining the frequency analysis synthesizing circuits 600 and 610, and any of the second embodiment to the fourth embodiment of the present invention.

As explained above in details, the fifth embodiment of the present invention generates the band-divided received signals by frequency-analyzing two received signals or more, generates the band-divided delayed received signals by delaying the above band-divided received signals, and activates the adaptive filters with the foregoing band-divided received signals and the foregoing band-divided delayed received signals taken as an input, respectively. The number of conditionals at the moment of obtaining the adaptive filter coefficients is increased because both of the band-divided received signal and the band-divided delayed received signal are used, and thus, the problem that the solutions become indefinite does not occur. Hence, the adaptive filter coefficients converge to the optimum values that are uniquely determined. Further, using a plurality of the delayed received signals makes it possible to furthermore increase the number of the foregoing conditionals and to shorten the convergence time of the solutions to the optimum values. In addition, generating the delayed received signals so that a difference between the left and right channels of the maximum value of a relative delay of the delayed signal in a channel, which is reproduced by each of the left and right loudspeakers located remotest from a center, to the received signal is zero in a status of taking into consideration a bias of the acoustic images due to the left-right asymmetry in the arrangement of the foregoing left and right loudspeakers enables the shift amounts of the acoustic image localization to the left and the right caused by the delayed received signals to be equalized with each other, and a degradation in the subjective sound quality to be made small. The fifth embodiment enables the optimum delays to be given to the band-divided signals, respectively, which leads to an increase in a degree of freedom at the moment of selecting the relative delay that is as large as possible within the allowable movement amount of the acoustic images, and an improvement in the subjective sound quality.

In the mode and the second to fifth embodiments above, while the echo cancellation, with a multi-channel teleconference system as a target, was discussed, a similar discussion holds also in a single-channel, multipoint teleconferencing system, being another application field of the signal processing. Normally, the single-channel, multipoint teleconferencing system performs the process of suitably adding an attenuation and a time delay to the voice of a talker received by a single microphone such that the talker is localized in a desired position between a plurality of loudspeakers to be used at the receive side. The signals processed in such a manner, of which the number is equivalent to that of the number of the loudspeakers at the receive side, are generated. When the number of the loudspeakers at the receive side is equal to 2, the two kinds of the signals, to which the above-mentioned attenuation and delay have been added in the embodiments shown in FIG. 1, FIG. 9, FIG. 11, FIG. 13, and FIG. 15, correspond to the first received signal 1 and the second received signal 2. Hence, the embodiments of the present invention can be applied without any change.

While the case of using the first received signal 1 and the second received signal 2, and the first mixed signal 14 and the second mixed signal 15 was exemplified herein for explanation, the present invention is applicable to the general case that plural received signals and a single or plural transmission signals exist. Further, even though the description was performed with an example of the acoustic echoes in which the received signal propagated from the loudspeakers to the microphone via the spatial acoustic paths and the acoustic echoes received by the microphone were cancelled, the present invention is applicable to an application for canceling the echoes other than the acoustic echoes, for example, the echoes caused by the crosstalk etc. in a transmission line. The infinite impulse response adaptive filters may be used instead of the finite impulse response adaptive filters. Further, subband adaptive filters or transform-domain adaptive filters may be used.

Figure 16:
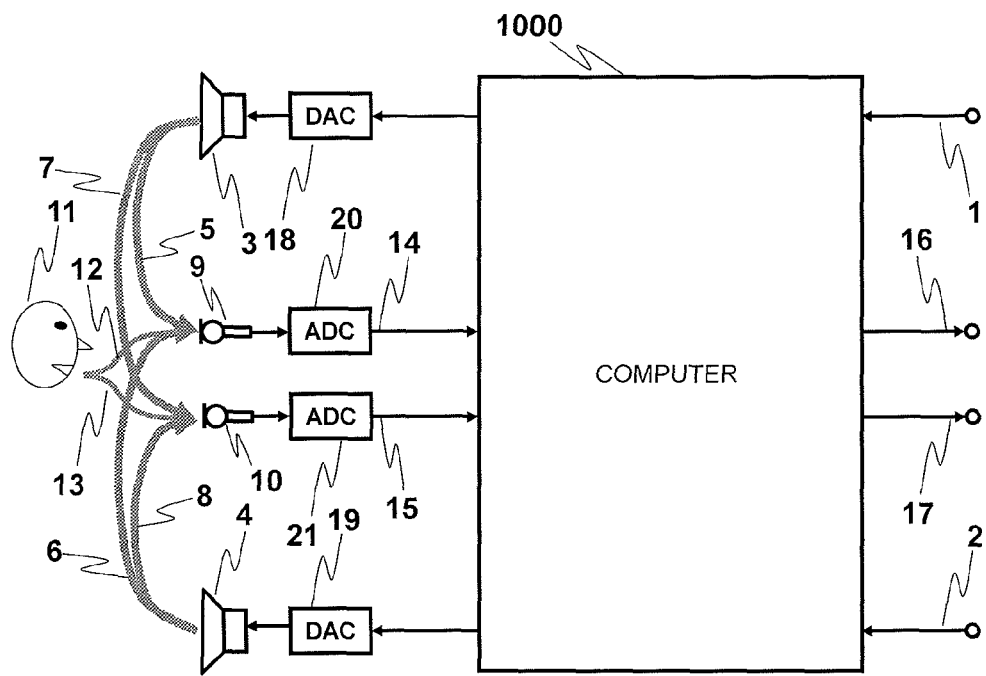
FIG. 16 is a block diagram illustrating a sixth embodiment of the present invention.
Figure 17:
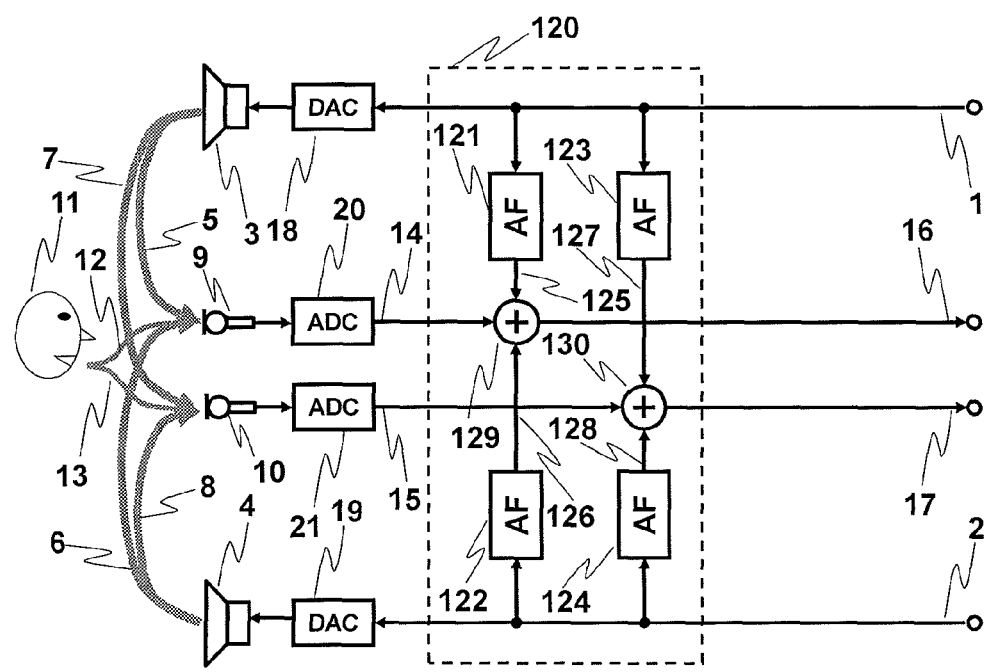
FIG. 17 is a block diagram illustrating the signal processing apparatus of the linear coupled type.

Continuously, the sixth embodiment of the present invention will be explained in details by making a reference to FIG. 16. The sixth embodiment of the present invention includes a computer 1000 that is operative under a program control. The computer 1000 is operative based upon a program for performing the processing related to any of the above-mentioned embodiment and the second embodiment to fifth embodiment for the received signals received from input terminals 1 and 2, and outputting the signals of which the echoes have been canceled as output signals 16 and 17.

The first example is characterized in that a signal processing method of receiving a plurality of received signals, and subtracting pseudo echoes generated by a plurality of adaptive filters having said plurality of received signals as an input, respectively, from a plurality of echoes to be generated from said plurality of received signals, thereby to reduce said plurality of echoes, comprising: generating delayed received signals by delaying two received signals or more, respectively, out of said plurality of received signals; and generating pseudo echoes by inputting said received signals and said delayed received signals into the adaptive filters.

The second example in the above-mentioned example is characterized in that at least one signal, out of said delayed received signals, is an amplitude-corrected delayed received signal subjected to an amplitude correction.

The third example in the above-mentioned examples is characterized in that at least one signal, out of the signals to be inputted into said plurality of adaptive filters, is a non-linearly processed signal subjected to a non-linear processing.

The fourth example in the above-mentioned examples is characterized in that the signal processing method comprises decomposing said received signal into a plurality of frequency components, and generating the delayed received signals by delaying the received signal for every above plurality of frequency components.

The fifth example in the above-mentioned examples is characterized in that the delayed received signals are generated so that relative delays of said delayed received signals have a plurality of values that vary with a time.

The sixth example in the above-mentioned examples is characterized in that the relative delay is an integer multiple of a sampling period.

The seventh example in the above-mentioned examples is characterized in that the delayed received signals are generated by processing the received signals with a filter having a plurality of time-varying coefficients with alternately a zero value or a non-zero value.

The eighth example in the above-mentioned examples is characterized in that the time-varying coefficients have a zero value exclusively to each other.

The ninth example in the above-mentioned examples is characterized in that the time-varying coefficients have a no-zero value exclusively to each other.

The tenth example is characterized in that a signal processing apparatus for receiving a plurality of received signals, and subtracting pseudo echoes generated by a plurality of adaptive filters having said plurality of received signals as an input, respectively, from a plurality of echoes to be generated from said plurality of received signals, thereby to reduce said plurality of echoes, comprising at least: a linear processing circuit for generating delayed received signals by delaying two received signals or more, respectively, out of said plurality of received signals; an adaptive filter for generating pseudo echoes by receiving said received signals and said delayed received signals, and a plurality of subtracters each generating echo-reduced signals by subtracting said pseudo echoes from said received signals, wherein said signal processing apparatus controlling said plurality of adaptive filters so that outputs of said plurality of subtracters are minimized.

The eleventh example in the above-mentioned example is characterized in that the signal processing apparatus comprises an amplitude correcting circuit for generating amplitude-corrected delayed received signals by amplitude-correcting at least one signal, out of said delayed received signals.

The twelfth example in the above-mentioned examples is characterized in that the signal processing apparatus comprises a non-linear processing circuit for generating non-linearly processed signals by non-linearly processing at least one signal, out of the signals to be inputted into said plurality of adaptive filters.

The thirteenth example in the above-mentioned examples is characterized in that the signal processing apparatus comprises: a frequency analyzing circuit for decomposing said received signal into a plurality of frequency components; and a linear processing circuit for generating the delayed received signals by delaying the received signal for every said plurality of frequency components.

The fourteenth example in the above-mentioned examples is characterized in that the linear processing circuit performs a processing such that relative delays of said delayed received signals have a plurality of values that vary with a time.

The fifteenth example in the above-mentioned examples is characterized in that the linear processing circuit performs a processing such that said relative delay is an integer multiple of a sampling period.

The sixteenth example in the above-mentioned examples is characterized in that the linear processing circuit comprises a filter having a plurality of time-varying coefficients with alternately a zero value or a non-zero value.

The seventeenth example in the above-mentioned examples is characterized in that the time-varying coefficients have a zero value exclusively to each other.

The eighteenth example in the above-mentioned examples is characterized in that the time-varying coefficients have a non-zero value exclusively to each other.

The nineteenth example is characterized in that a signal processing program for causing a computer to execute: a receiving process of receiving a plurality of received signals; and an echo reducing process of reducing a plurality of echoes that are generated by said plurality of received signals, said signal processing program causing the computer to execute: a delayed received signal generating process of generating delayed received signals by delaying two received signals or more, respectively, out of said plurality of received signals; a pseudo echo generating process of generating pseudo echoes by inputting said received signals and said delayed received signals into the adaptive filters; and a pseudo echo subtracting process of subtracting said pseudo echoes from said plurality of received signals, respectively.

The twentieth example in the above-mentioned example is characterized in that at least one signal, out of said delayed received signals, is an amplitude-corrected delayed received signal subjected to an amplitude correction.

The twenty-first example in the above-mentioned examples is characterized in that at least one signal, out of the signals to be inputted into said plurality of adaptive filters, is a non-linearly processed signal subjected to a non-linear processing.

The twenty-second example in the above-mentioned examples is characterized in that the signal processing program comprising decomposing said received signal into a plurality of frequency components and generating the delayed received signals by delaying the received signal for every above plurality of frequency components.

The twenty-third example in the above-mentioned examples is characterized in that the delayed received signals are generated so that relative delays of said delayed received signals have a plurality of values that vary with a time.

The twenty-fourth example in the above-mentioned examples is characterized in that the relative delay is an integer multiple of a sampling period.

The twenty-fifth example in the above-mentioned examples is characterized in that the delayed received signals are generated by processing the received signals with a filter having a plurality of time-varying coefficients with alternately a zero value or a non-zero value.

The twenty-sixth example in the above-mentioned examples is characterized in that the time-varying coefficients have a zero value exclusively to each other.

The twenty-seventh example in the above-mentioned examples is characterized in that the time-varying coefficients have a non-zero value exclusively to each other.

Above, although the present invention has been particularly described with reference to the preferred embodiments and examples thereof, it should be readily apparent to those of ordinary skill in the art that the present invention is not always limited to the above-mentioned embodiment and examples, and changes and modifications in the form and details may be made without departing from the spirit and scope of the invention.

This application is based upon and claims the benefit of priority from Japanese patent application No. 2008-247272, filed on Sep. 26, 2008, the disclosure of which is incorporated herein in its entirety by reference.

REFERENCE SIGNS LIST 1 and 2 received signals
3 and 4 loudspeakers
5, 6, 7, and 8 echoes
9 and 10 microphones talker
12 and 13 transmission signals
14 and 15 mixed signals
16 and 17 output signals of a signal processing apparatus
18 and 19 digital-analogue converters
20 and 21 analogue-digital converters
121, 122, 123, and 124 adaptive filters
125, 126, 127, and 123 pseudo echoes
129 and 130 subtracters 300 delay processing circuit
310 and 320 filters
330 and 430 clock changing circuits
400 amplitude correcting circuit
410 and 420 amplitude processing circuits
500 and 501 non-linear processing circuits
510, 520, 530, and 540 non-linear amplitude processing circuits
511, 531, 3100, 3105, 4100, and 4105 input terminals
513 polarity determining circuit
514 multiplier
515 and 3103 adders
516, 536, 3104, and 4104 output terminals
600 and 610 frequency analysis synthesizing circuits
1000 computer
3101 delay element
3102 and 4101 coefficient multipliers

The invention claimed is:

1. A signal processing method of receiving a plurality of received signals, and subtracting pseudo echoes generated by a plurality of adaptive filters having said plurality of received signals as an input, respectively, from a plurality of echoes to be generated from said plurality of received signals, thereby to cancel by delaying said plurality of echoes, comprising:
generating delayed received signals by delaying two or more of said received signals; and
generating pseudo echoes by alternately inputting said received signals and said delayed received signals into the adaptive filters,
wherein at least one input to the adaptive filter has a different alternating timing from other inputs to the adaptive filters.

2. A signal processing method according to claim 1, wherein at least one of said delayed received signals is an amplitude-corrected delayed received signal subjected to an amplitude correction.

3. A signal processing method according to claim 1, wherein at least one of said input signals of adaptive filters is a non-linearly processed signal subjected to a non-linear processing.

4. A signal processing method according to claim 1, comprising decomposition of said received signal into a plurality of frequency components, and generating the delayed received signals by delaying the received signal for each of said plurality of frequency components.

5. A signal processing method according to claim 1, wherein said delayed received signals are generated so that relative delays of said delayed received signals have a plurality of values that vary with time.

6. A signal processing method according to claim 5, wherein said relative delay is an integer multiple of a sampling period.

7. A signal processing method according to claim 1, wherein said delayed received signals are generated by processing the received signals with filters having a plurality of time-varying coefficients which alternately take a zero or a non-zero value.

8. A signal processing method according to claim 7, wherein said plurality of time-varying coefficients have a zero value exclusively to each other.

9. A signal processing method according to claim 7, wherein said plurality of time-varying coefficients have a non-zero value exclusively to each other.

10. A signal processing apparatus for receiving a plurality of received signals, and subtracting pseudo echoes generated by a plurality of adaptive filters having said plurality of received signals as an input, respectively, from a plurality of echoes to be generated from said plurality of received signals, thereby to cancel by delaying said plurality of echoes, comprising at least:
a linear processing circuit that generates delayed received signals by delaying two or more of said received signals;
an adaptive filter that generates pseudo echoes by alternately receiving said received signals and said delayed received signals, and
a plurality of subtractors, each of said subtractors that generates echo-reduced signals by subtracting said pseudo echoes from said received signals,
wherein said signal processing apparatus controls said plurality of adaptive filters so that outputs of said plurality of subtractors are minimized, and
wherein at least one input to the adaptive filter has a different alternating timing from other inputs to the adaptive filters.

11. A signal processing apparatus according to claim 10, comprising an amplitude correcting circuit that generates amplitude-corrected delayed received signals by amplitude-correcting at least one of said delayed received signals.

12. A signal processing apparatus according to claim 10, comprising a non-linear processing circuit that generates non-linearly processed signals by non-linearly processing at least one of said input signals of adaptive filters.

13. A signal processing apparatus according to claim 12 comprising:
a frequency analyzing circuit that decomposes said received signal into a plurality of frequency components; and
a linear processing circuit that generates the delayed received signals by delaying the received signal for every said plurality of frequency components.

14. A signal processing apparatus according to claim 10, wherein said linear processing circuit performs a processing such that relative delays of said delayed received signals have a plurality of values that vary with time.

15. A signal processing apparatus according to claim 14, wherein said linear processing circuit performs a processing such that said relative delay is an integer multiple of a sampling period.

16. A signal processing apparatus according to claim 10, wherein said linear processing circuit comprises a filter having a plurality of time-varying coefficients which alternately take a zero or a non-zero value.

17. A signal processing apparatus according to claim 16, wherein said plurality of time-varying coefficients have a zero value exclusively to each other.

18. A signal processing apparatus according to claim 16, wherein said plurality of time-varying coefficients have a non-zero value exclusively to each other.

19. A non-transitory computer readable storage medium storing a signal processing program for causing a computer to execute:
a receiving process of receiving a plurality of received signals; and
an echo reducing process of reducing a plurality of echoes that are generated by said plurality of received signals, said signal processing program causing the computer to execute:
a delayed received signal generating process of generating delayed received signals by delaying two or more of said received signals;

a pseudo echo generating process of generating pseudo echoes by alternately inputting said received signals and said delayed received signals into the adaptive filters; and a pseudo echo subtracting process of subtracting said pseudo echoes from said plurality of received signals, respectively, wherein at least one input to the adaptive filter has a different alternating timing from other inputs to the adaptive filters.

20. A non-transitory computer readable storage medium storing a signal processing program according to claim 19, wherein at least one of said delayed received signals is an amplitude-corrected delayed received signal subjected to an amplitude correction.

21. A non-transitory computer readable storage medium storing a signal processing program according to claim 19, wherein at least one of said input signals of adaptive filters is a non-linearly processed signal subjected to a non-linear processing.

22. A non-transitory computer readable storage medium storing a signal processing program according to claim 19, said signal processing program comprising decomposition of said received signal into a plurality of frequency components and generating the delayed received signals by delaying the received signal for each of said plurality of frequency components.

23. A non-transitory computer readable storage medium storing a signal processing program according to claim 19, wherein said delayed received signals are generated so that relative delays of said delayed received signals have a plurality of values that vary with time.

24. A non-transitory computer readable storage medium storing a signal processing program according to claim 23, wherein said relative delay is an integer multiple of a sampling period.

25. A non-transitory computer readable storage medium storing a signal processing program according to claim 19, wherein said delayed received signals are generated by processing the received signals with filters having a plurality of time-varying coefficients which alternately take a zero or a non-zero value.

26. A non-transitory computer readable storage medium storing a signal processing program according to claim 25, wherein said plurality of time-varying coefficients have a zero value exclusively to each other.

27. A non-transitory computer readable storage medium storing a signal processing program according to claim 25, wherein said plurality of time-varying coefficients have a non-zero value exclusively to each other.

\* \* \* \* \*

UNITED STATES PATENT AND TRADEMARK OFFICE
CERTIFICATE OF CORRECTION

| | | |
|---|---|---|
| PATENT NO. | : 9,497,330 B2 | Page 1 of 1 |
| APPLICATION NO. | : 13/120777 | |
| DATED | : November 15, 2016 | |
| INVENTOR(S) | : Akihiko Sugiyama | |

It is certified that error appears in the above-identified patent and that said Letters Patent is hereby corrected as shown below:

On the Title Page

Column 1, Line 2 Item (54): Delete "DEVICE" and insert --APPARATUS--

In the Specification

Column 1, Line 2: Delete "DEVICE," and insert --APPARATUS,--

Column 10, Line 34: Delete "$c_{L1}$" and insert --$c_{L-1}$--

Column 10, Line 59: Delete "$3103_{L-A}$" and insert --$3103_{L-1}$--

Column 18, Line 13: Delete "15" and insert --515--

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*